US011042085B2

(12) United States Patent
Ono et al.

(10) Patent No.: US 11,042,085 B2
(45) Date of Patent: Jun. 22, 2021

(54) PELLICLE FILM, PELLICLE FRAME, PELLICLE, METHOD FOR PRODUCING SAME, ORIGINAL PLATE FOR LIGHT EXPOSURE, LIGHT EXPOSURE APPARATUS AND METHOD FOR MANUFACTURING SEMICONDUCTOR DEVICE

(71) Applicants: MITSUI CHEMICALS, INC., Tokyo (JP); NATIONAL INSTITUTE OF ADVANCED INDUSTRIAL SCIENCE AND TECHNOLOGY, Tokyo (JP)

(72) Inventors: Yosuke Ono, Sodegaura (JP); Atsushi Okubo, Tokyo (JP); Kazuo Kohmura, Chiba (JP); Atsuko Sekiguchi, Tsukuba (JP); Yuichi Kato, Tsukuba (JP); Takeo Yamada, Tsukuba (JP)

(73) Assignees: MITSUI CHEMICALS, INC., Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 16/224,028

(22) Filed: Dec. 18, 2018

(65) Prior Publication Data
US 2019/0129300 A1   May 2, 2019

Related U.S. Application Data

(63) Continuation of application No. PCT/JP2017/024335, filed on Jul. 3, 2017.

(30) Foreign Application Priority Data

Jul. 5, 2016   (JP) .............................. JP2016-133062

(51) Int. Cl.
G03F 1/62 (2012.01)
G03F 1/64 (2012.01)
C01B 32/162 (2017.01)
C01B 32/159 (2017.01)
G03F 7/20 (2006.01)
H01L 21/027 (2006.01)

(52) U.S. Cl.
CPC .............. G03F 1/64 (2013.01); C01B 32/159 (2017.08); C01B 32/162 (2017.08); G03F 1/62 (2013.01); G03F 7/70033 (2013.01); G03F 7/70983 (2013.01); H01L 21/0274 (2013.01); C01B 2202/02 (2013.01)

(58) Field of Classification Search
CPC ...... G03F 1/62; G03F 7/70983; C01B 32/162; C01B 32/174; C01B 32/159
See application file for complete search history.

(56) References Cited

U.S. PATENT DOCUMENTS

| 7,379,154 | B2  |   | 5/2008  | Bruls et al. |
| 7,767,985 | B2† |   | 8/2010  | Okoroanyanwu |
| 8,351,220 | B2† |   | 1/2013  | Liang |
| 9,703,187 | B2  |   | 7/2017  | Ono et al. |
| 9,897,930 | B2† |   | 2/2018  | Sjmaenok |
| 2005/0140949 | A1 |   | 6/2005  | Jasper et al. |
| 2008/0152873 | A1 |   | 6/2008  | Okoroanyanwu et al. |
| 2008/0318049 | A1 |   | 12/2008 | Hata et al. |
| 2009/0181239 | A1† |   | 7/2009 | Fan |
| 2010/0044230 | A1* |   | 2/2010 | Papadimitrakopoulos ................. B01D 15/08 204/547 |
| 2010/0159222 | A1† |   | 6/2010 | Hata |
| 2011/0249243 | A1 |   | 10/2011 | Sjmaenok et al. |
| 2012/0298618 | A1† |   | 11/2012 | Jiang |
| 2013/0316160 | A1 |   | 11/2013 | Hata et al. |
| 2016/0147141 | A1 |   | 5/2016  | Ono et al. |
| 2016/0367971 | A1* |   | 12/2016 | Zhuo .................... B01J 37/0225 |
| 2017/0038676 | A1* |   | 2/2017  | Jung ........................ G03F 1/62 |

(Continued)

FOREIGN PATENT DOCUMENTS

| CN | 101010260 A | 8/2007 |
| CN | 103201214 A | 7/2013 |
| EP | 3 404 487 A1 | 11/2018 |

(Continued)

OTHER PUBLICATIONS

Jiang et al.: "Superaligned Carbon Nanotube Arrays, Films, and Yarns: A Road to Applications," Advanced Materials, 2011, 23, 1154-1161 (8 pages).

(Continued)

Primary Examiner — Daborah Chacko-Davis
(74) Attorney, Agent, or Firm — Buchanan Ingersoll & Rooney PC

(57) ABSTRACT

Provided are a pellicle film, a pellicle frame and a pellicle having a higher EUV transmittance. An exposure pattern plate capable of performing EUV lithography with the pellicle film, the pellicle frame or the pellicle, and a method for producing a semiconductor device, are provided. A pellicle film for exposure extendable over an opening of a support frame and having a thickness of 200 nm or less is provided. The film includes a carbon nanotube sheet. The carbon nanotube sheet includes bundles each including a plurality of carbon nanotubes, the bundles each have a diameter of 100 nm or shorter, and the bundles are aligned in a planar direction in the carbon nanotube sheet.

24 Claims, 19 Drawing Sheets

(56) References Cited

U.S. PATENT DOCUMENTS

2017/0184956 A1   6/2017  Kohmura et al.
2017/0184957 A1   6/2017  Kohmura et al.

FOREIGN PATENT DOCUMENTS

| | | | |
|---|---|---|---|
| EP | 3412808 | A1 | 12/2018 |
| JP | 2001048507 | A | 2/2001 |
| JP | 2004-343102 | A | 12/2004 |
| JP | 2006069165 | A | 3/2006 |
| JP | 2011530184 | A | 12/2011 |
| JP | 2014-227331 | A | 12/2014 |
| JP | 2014-228868 | A | 12/2014 |
| JP | 2014227331 | A † | 12/2014 |
| JP | 2015003859 | A | 1/2015 |
| KR | 10-2007-0064582 | A | 6/2007 |
| KR | 10-2011-0055601 | A | 5/2011 |
| WO | 2006011655 | A1 | 2/2006 |
| WO | 2014142125 | A1 | 9/2014 |
| WO | 2014188710 | A1 | 11/2014 |
| WO | 2016/043292 | A1 | 3/2016 |
| WO | 2016/043301 | A1 | 3/2016 |
| WO | 2016/079051 | A2 | 5/2016 |

OTHER PUBLICATIONS

International Search Report (PCT/ISA/210) dated Sep. 26, 2017, by the Japanese Patent Office as the International Searching Authority for International Application No. PCT/JP2017/024335.
Atkinson et al., "Multifunctional carbon nanotube yarns and transparent sheets: Fabrication, properties, and applications," Physica B, 2007, vol. 394, pp. 339-343.
Pollentier, I. et al.,"EUV lithography imaging using novel pellicle membranes", Proc. SPIE 9776, Extreme Ultraviolet (EUV) Lithography VII, 977620 (Mar. 18, 2016); doi:10.1117/12.2220031 (15 pages).
Lee et al., "Introducing the EUV CNT pellicle." Proc. SPIE 9985, Photomask Technology 2016, 99850C (Oct. 25, 2016), doi:10.1117/12.2243019 (8 pages).
Pollentier et al., "EUV lithography imaging using novel pellicle membranes", Proc. SPIE 9776, Extreme Ultraviolet (EUV) Lithography VII, 977620 (Mar. 18, 2016); doi:10.1117/12.2220031 (15 pages).
Pollentier et al., "Novel membrane solutions for the EUV pellicle: better or not?" Proc. SPIE 10143, Extreme Ultraviolet (EUV) Lithography VIII, 101430L (Mar. 24, 2017), doi:10.1117/12.2257891 (10 pages).
Kaili Jiang et al., Superaligned Carbon Nanotube Arrays, Films, and Yarns: A Road to Applications, 1154-1161, 2011, Wiley-VCH Verlag GmbH & Co. KGaA, Weinheim, DE.†

\* cited by examiner
† cited by third party

PELLICLE FILM, PELLICLE FRAME, PELLICLE, METHOD FOR PRODUCING SAME, ORIGINAL PLATE FOR LIGHT EXPOSURE, LIGHT EXPOSURE APPARATUS AND METHOD FOR MANUFACTURING SEMICONDUCTOR DEVICE

CROSS REFERENCE TO RELATED APPLICATIONS

This application is based upon and claims the benefit of priority from the prior Japanese Patent Application No. 2016-133062, filed on Jul. 5, 2016, and PCT Application No. PCT/JP2017/024335, filed on Jul. 3, 2017, the entire contents of which are incorporated herein by reference.

FIELD

The present invention relates to a photomask or a reticle (hereinafter, collectively referred to as a "photomask") usable to produce a semiconductor device or the like by a lithography technology, and to a pellicle or the like acting as a dust-preventive cover for the photomask that prevents dust or the like from being attached to the photomask. The present invention specifically relates to a pellicle film, which is a very thin film for extreme ultraviolet (EUV) lithography, a pellicle frame, a pellicle, a method for producing the same, an exposure pattern plate using the same, and a method for producing a semiconductor device.

BACKGROUND

A semiconductor device is produced by a method including a step referred to as lithography. In the step of lithography, an exposure device referred to as a scanner or a stepper is used to cause exposure light to irradiate a mask having a circuit pattern drawn thereon, so that the circuit pattern is transferred to a semiconductor wafer coated with a photoresist. If, in this step, a foreign substance such as dust or the like is attached to the mask, the shadow of the foreign substance is transferred to the semiconductor wafer, and the circuit pattern is not transferred accurately. As a result, the resultant semiconductor device may not operate normally and become defective.

In order to avoid such a situation, it is known that a pellicle including a support frame and a pellicle film bonded to the frame is attached to the mask, so that a foreign substance such as dust or the like is attached to the pellicle film and is prevented from being attached to the mask. A focal point of exposure light of the exposure device is set on a surface of the mask and a surface of the semiconductor wafer, but is not set on a surface of the pellicle film. Therefore, an image of the shadow of the foreign substance attached to the pellicle film is not formed on the semiconductor wafer. For this reason, in the case where the foreign substance is attached to the pellicle film, the degree at which the transfer of the circuit pattern is disturbed is significantly lower than in the case where the foreign substance is attached to the mask. Thus, the ratio of defective products of the semiconductor device is significantly suppressed.

The pellicle film usable for the pellicle is required to transmit exposure light at a high transmittance, for the following reason. If the light transmittance of the pellicle film is low, the intensity of the exposure light from the mask having the circuit pattern formed thereon is decreased, and thus the photoresist formed on the semiconductor wafer is not sufficiently exposed to the exposure light.

So far, the wavelength of light used for lithography has been progressively shortened. As a next-generation lithography technology, EUV lithography is now being progressively developed. "EUV light" refers to light having a wavelength in a soft x-ray range or a vacuum ultraviolet range; more specifically, a light beam having a wavelength of about 13.5 nm±about 0.3 nm. In photolithography, the resolution limit of a pattern is about ½ of the exposure wavelength, and is considered to be about ¼ of the exposure wavelength even if an immersion method is used. Even if an immersion method is used with ArF laser light (wavelength: 193 nm), the exposure wavelength is expected to be about 45 nm at the minimum. In such a situation, EUV lithography is anticipated as a revolutionary technology that realizes significant reduction in size as compared with the conventional lithography.

EUV light is easily absorbed by any substance. When the exposure light such as EUV light or the like irradiates the pellicle film, a part of the energy thereof is absorbed by the pellicle film. The energy of the EUV light absorbed by the pellicle film is converted into heat by various relaxation processes. Therefore, at the time of exposure, the temperature of the pellicle film is raised. In addition, in a pellicle for EUV, a pellicle film connected with the pellicle needs to have a very small thickness of a nanometer order. Therefore, a pellicle film having a higher EUV transmittance is now desired from the points of view of heat releasability and heat resistance when the temperature is raised to a high level.

PCT Japanese National-Phase Laid-Open Patent Publication No. 2011-530184 discloses an invention relating to an "optical element for a lithographic apparatus", and specifically describes that a carbon nanotube sheet is used, that the carbon nanotube sheet may include a "single-walled carbon nanotube sheet" or a "multi-walled carbon nanotube sheet", and that the carbon nanotube sheet has an advantage of having a relatively low density.

WO2014/142125 relates to a pellicle film and a pellicle, and describes that if the density of the pellicle film is increased in order to increase the strength thereof, a high transmittance is not provided, and that a carbon nanotube contains lots of impurities such as a metal material or the like incorporated thereto during the production thereof and thus has a low transmittance.

Japanese Laid-Open Patent Publication No. 2001-48507 discloses carbon nanotube sheets having carbon nanotube diameters of 3 nm to 8 nm and 10 nm to 15 nm.

Patent Literature 4 discloses a carbon nanotube sheet having a cylinder diameter of about 1 nm to about 1000 nm, an axial direction length of about 0.1 µm to about 1000 µm, and an L/D of about 100 to about 10000.

SUMMARY

The present invention provides a pellicle film, a pellicle frame and a pellicle having a higher EUV transmittance and a higher heat resistance than those described in the above-described prior art documents. The present invention also provides an exposure pattern plate using the same to allow EUV lithography to be performed at a high precision and a method for producing a semiconductor device.

Provided in order to solve the above-described problem is a pellicle film for exposure, the pellicle film being extendable over an opening of a support frame and having a thickness of 200 nm or less. The pellicle film includes a carbon nanotube sheet. The carbon nanotube sheet includes bundles each including a plurality of carbon nanotubes, the bundles each have a diameter of 100 nm or shorter, and the bundles are aligned in a planar direction in the carbon nanotube sheet.

With the above-described structure, a pellicle film fulfilling, at the same time, the conditions that the pellicle film has a thickness of 200 nm or less, that the pellicle film includes a carbon nanotube sheet, that the carbon nanotube sheet includes bundles each including a plurality of carbon nanotubes, that the bundles each have a diameter of 100 nm or shorter, and that the bundles are aligned in a planar direction in the carbon nanotube sheet is provided. Such a pellicle film has a high EUV transmittance, has a high durability against EUV, and has a film strength that withstands the pellicle production process and the steps in which the pellicle film is subjected to an atmospheric pressure and also to a vacuum state in an EUV exposure system.

In an embodiment according to the present invention, the carbon nanotubes may each have a diameter of 0.8 nm or longer and 6 nm or shorter.

In an embodiment according to the present invention, the carbon nanotube sheet may have a mesh structure of the bundles in the planar direction.

In an embodiment according to the present invention, the pellicle film for exposure may further include a protective layer in contact with the carbon nanotube sheet.

In an embodiment according to the present invention, the protective layer may contain at least one selected from the group consisting of $SiO_x$ ($x \leq 2$), $Si_aN_b$ (a/b is 0.7 to 1.5), SiON, $Y_2O_3$, YN, Mo, Ru, Rb, Sr, Y, Zr, Nb, $B_4C$, SiC and Rh.

Also provided in order to solve the above-described problem is a pellicle film including a carbon nanotube sheet including carbon nanotubes each having a diameter of 0.8 nm or longer and 6 nm or shorter, a length of 10 μm or longer and 10 cm or shorter, and a carbon content of 98% by mass or higher.

With the above-described structure, a pellicle film fulfilling, at the same time, the conditions that the carbon nanotubes have a high purity as represented by the carbon content as high as 98% by mass or higher, that the carbon nanotubes each have a diameter of 0.8 nm or longer and 6 nm or shorter, and that the carbon nanotubes each have a length of 10 μm or longer and 10 cm or shorter is provided. Such a pellicle film has a high EUV transmittance, has a high durability against EUV, and has a film strength that withstands the pellicle production process and the steps in which the pellicle film is subjected to an atmospheric pressure and also to a vacuum state in an EUV exposure system.

In an embodiment according to the present invention, the ratio of the length with respect to the diameter of each of the carbon nanotubes (length/diameter) may be $1 \times 10^4$ or higher and $1 \times 10^8$ or lower.

In the case where the diameter of the carbon nanotubes is short, the film strength of the pellicle film is improved but the EUV transmittance is decreased. In order to provide both of a high EUV transmittance and a high film strength, the ratio of the length with respect to the diameter of the nanotube (length/diameter) is important. In the case where the ratio is $1 \times 10^4$ or higher and $1 \times 10^8$ or lower, both of a high EUV transmittance and a high film strength are provided.

In an embodiment according to the present invention, the pellicle film may further include a protective layer in contact with the carbon nanotube sheet. The protective layer may be provided on a surface of the pellicle film closer to the pattern plate or may be provided as an uppermost layer on the pellicle film.

In an embodiment according to the present invention, the protective layer may contain at least one selected from the group consisting of $SiO_x$ ($x \leq 2$), $Si_aN_b$ (a/b is 0.7 to 1.5), SiON, $Y_2O_3$, YN, Mo, Ru, Rb, Sr, Y, Zr, Nb, $B_4C$, SiC and Rh.

In the case where protective layer is provided, the pellicle film is tolerant to both of hydrogen radical (i.e., reduction-tolerant) and oxidation.

In an embodiment according to the present invention, a pellicle including the above-described pellicle and a support frame supporting the pellicle film may be provided.

In an embodiment according to the present invention, a pellicle frame including the above-described pellicle film and a first frame supporting the pellicle film may be provided.

In an embodiment according to the present invention, a pellicle including the above-described pellicle frame and a second frame connected with the pellicle frame may be provided.

In an embodiment according to the present invention, an exposure pattern plate including a pattern plate; and a pellicle attached to a surface, of the pattern plate, that has a pattern thereon may be provided.

In an embodiment according to the present invention, an exposure device including the above-described exposure pattern plate may be provided.

In an embodiment according to the present invention, an exposure device may be provided. The exposure device includes a light source releasing exposure light; the above-described exposure pattern plate; and an optical system guiding the exposure light released from the light source to the exposure pattern plate. The exposure pattern plate is located such that the exposure light released from the light source is transmitted through the pellicle film to irradiate the pattern plate.

In an embodiment according to the present invention, the exposure light may be EUV light.

In an embodiment according to the present invention, a method for producing a semiconductor device is provided. The method includes the steps of causing exposure light, released from a light source, to be transmitted through the pellicle film of the exposure pattern plate and to irradiate, and to be reflected by, the pattern plate; and causing the exposure light, reflected by the pattern plate, to be transmitted through the pellicle film and to irradiate a sensitive substrate, so that the exposure light exposes the sensitive substrate while having a shape of a pattern.

In an embodiment according to the present invention, the exposure light may be EUV light.

In an embodiment according to the present invention, a method for producing a pellicle is provided. The method includes incorporating water vapor of 10 ppm or higher and 10000 ppm or lower at a temperature of 600° C. or higher and 1000° C. or lower in the presence of a metal catalyst to form a carbon nanotube by chemical vapor deposition; putting the resultant carbon nanotube into a sheet to form a carbon nanotube sheet; and connecting the resultant carbon nanotube sheet to a support frame including an opening such that the resultant carbon nanotube sheet covers the opening.

A method for producing a pellicle is provided. The method includes forming a carbon nanotube sheet from a dispersion containing a carbon nanotube, and connecting the resultant carbon nanotube sheet to a support frame including an opening such that the resultant carbon nanotube sheet covers the opening.

In an embodiment according to the present invention, a method for producing a pellicle in which the metal catalyst is located on a substrate for chemical vapor deposition is provided.

In an embodiment according to the present invention, a method for producing a pellicle is provided. The method includes patterning a metal catalyst on a substrate for chemical vapor deposition, and incorporating water vapor of 10 ppm or higher and 10000 ppm or lower at a temperature of 600° C. or higher and 1000° C. or lower in the presence of the metal catalyst to form a plurality of single-walled carbon nanotubes by chemical vapor deposition and thus to form a carbon nanotube bulk structure; putting the resultant carbon nanotube bulk structure into a sheet to form a carbon nanotube sheet; and connecting the resultant carbon nanotube sheet to a support frame including an opening such that the resultant carbon nanotube sheet covers the opening. The formation of the plurality of single-walled carbon nanotubes by CVD may be forming the plurality of single-walled carbon nanotubes standing perpendicularly to a surface of the substrate by CVD.

In an embodiment according to the present invention, a method for producing a pellicle is provided. The method includes forming a carbon nanotube sheet of a dispersion containing carbon nanotubes; and connecting the resultant carbon nanotubes to a support frame including an opening such that the resultant carbon nanotubes covers the opening.

Figure 1A:
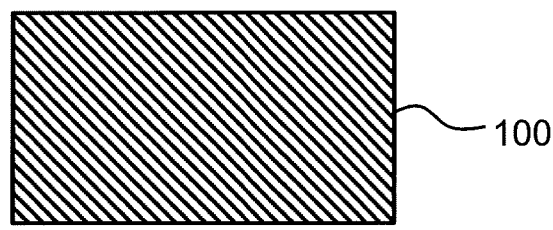
FIG. 1A provides schematic (cross-sectional) views showing a step for producing a pellicle film, a pellicle frame and a pellicle in an embodiment according to the present invention.

REFERENCE SIGNS LIST 10, 20 Pellicle
100 Substrate 102, 202 Pellicle film
104 Mask
106 Protective layer
107 First frame
108 Second frame
109, 209 Support frame
112 Pressure-sensitive adhesive sheet
124 Bridge
130 Hole
180 Exposure device
181 Exposure pattern plate
182 Light source
183 Illumination optical system
184 Plate
185, 186 Filter window
187 Sensitive substrate
188 Projection optical system
189-191 Multi-layer mirror

DESCRIPTION OF EMBODIMENTS

Hereinafter, embodiments of the present invention will be described with reference to the drawings and the like. The present invention may be carried out in various forms, and is not to be construed as being limited to any of the following embodiments. In the drawings, components may be shown schematically regarding the width, thickness, shape and the like, instead of being shown in accordance with the actual sizes, for the sake of clearer illustration. The drawings are merely examples and do not limit the interpretations of the present invention in any way. In the specification and the drawings, components that have substantially the same functions as those described before with reference to a previous drawing(s) bear the identical reference signs thereto, and detailed descriptions thereof may be omitted.

[Definitions]

In this specification, an expression that a component or area is "above" (or "below") another component or area encompasses a case where such a component or area is over (under) the another component or area and also a case where such a component or area is on the another component or area, namely, a case where still another component or area is provided between such a component or area and the another component or area, unless otherwise specified.

In this specification, "EUV light" refers to light having a wavelength of 5 nm or longer and 30 nm or shorter. It is preferred that the wavelength of the EUV light is 5 nm or longer and 14 nm or shorter.

In this specification, a "pellicle film" refers to a thin film usable for a pellicle. It is preferred that the pellicle film is a self-standing film. The "self-standing film" is a thin film retaining the shape thereof without a support or a substrate.

A "pellicle" is an assembly of a pellicle film and a support frame supporting the pellicle film. A "pellicle frame" refers to an assembly of the pellicle film and a first frame connected with the pellicle film. The "pellicle" encompasses an assembly of the pellicle frame and a second frame connected with the pellicle frame. In this case, the first frame and the second frame correspond to a support frame supporting the pellicle film.

In this specification, "trimming" refers to cutting a substrate, or an assembly of the substrate and the pellicle film formed above the substrate, in accordance with a desired pellicle shape. The shape of the pellicle is often rectangular. Therefore, in this specification, an example of cutting the substrate, or an assembly of the substrate and the pellicle film formed above the substrate, into a rectangular shape is shown as a specific example of trimming.

In this specification, "back-etching" refers to a step of removing a part of the substrate while leaving the pellicle film. In this specification, etching of the substrate from a rear surface thereof (surface opposite to a surface having the pellicle film formed thereon) is shown as an example of back-etching.

In this specification, an "end portion" refers to a side surface, a corner edge and a corner area. Specifically, the "end portion" encompasses a corner edge formed by side surfaces of a substrate (first frame in the case where the substrate is used as the first frame) or a support frame, a corner edge formed by a top surface of the substrate (surface in contact with the pellicle film) and a side surface of the substrate, and a corner area including a point at which the top surface and two side surfaces of the substrate cross each other.

In the present invention, a "bundle" refers to a bundle formed of a plurality of carbon nanotubes.

In the present invention, regarding a two-dimensional diffraction image of a cross-section of a carbon nanotube, a direction along the film surface will be referred to as a "planar direction", and a direction perpendicular to the planar direction will be referred to as a "thickness direction".

In the present invention, the expression that the bundle is "aligned in the planar direction" indicates that a longer axis direction of the carbon nanotube bundle and of the carbon nanotubes is the same as the planar direction of the carbon nanotube sheet. In other words, the expression indicates that the length direction of the bundles is not the thickness direction (Z-axis direction) but is the planar direction (XY direction). The length direction of the bundles does not need to match an X-axis direction or a Y-axis direction, and may form a mesh structure.

In the present invention, the expression that the bundle is "aligned in the thickness direction" indicates that the longer axis direction of the carbon nanotube bundle and of the carbon nanotubes is the same as the thickness direction of the carbon nanotube sheet.

[Problems of the Conventional Technology Found in the Process of Conceiving the Present Invention]

A pellicle film for a EUV pellicle is usually produced by stacking SiN (silicon nitride) or the like above a silicon wafer. Another type of pellicle film for a EUV pellicle is a carbon nanotube sheet (PCT Japanese National-Phase Laid-Open Patent Publication No. 2011-530184). However, WO2014/142125 describes that if the density of the pellicle film is increased in order to increase the strength thereof, a high transmittance is not provided, and that a carbon nanotube contains lots of impurities such as a metal material or the like incorporated thereto during the production thereof and thus has a low transmittance.

A low purity of the carbon nanotube sheet indicates that the carbon nanotube sheet contains lots of impurities. In this case, the carbon nanotube sheet has a low EUV transmittance and easily absorbs EUV. When the pellicle film absorbs the EUV, the energy of the EUV is converted into heat. Therefore, a portion of the pellicle film irradiated with the EUV becomes of a high temperature, and as a result, the durability of the pellicle film is decreased. Namely, it has been found that in the case where the purity of the carbon nanotube sheet is low, the strength and the EUV transmittance of the pellicle film are decreased. The present inventors conceived a pellicle film according to the present invention having a high EUV transmittance using a carbon nanotube sheet.

Embodiment 1

Figure 1B:
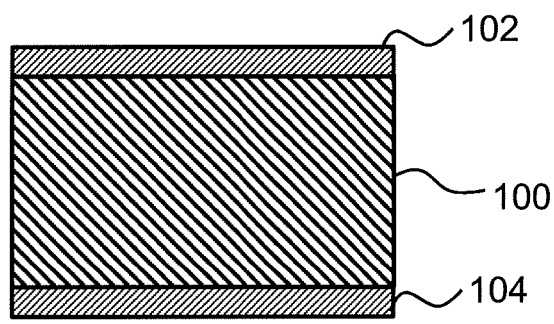
FIG. 1B provides schematic (cross-sectional) views showing a step for producing a pellicle film, a pellicle frame and a pellicle in an embodiment according to the present invention.
Figure 1C:
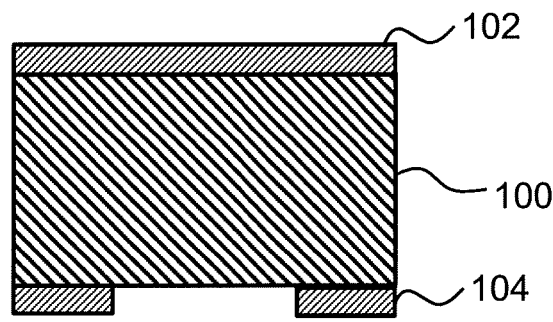
FIG. 1C provides schematic (cross-sectional) views showing a step for producing a pellicle film, a pellicle frame and a pellicle in an embodiment according to the present invention.
Figure 2A:
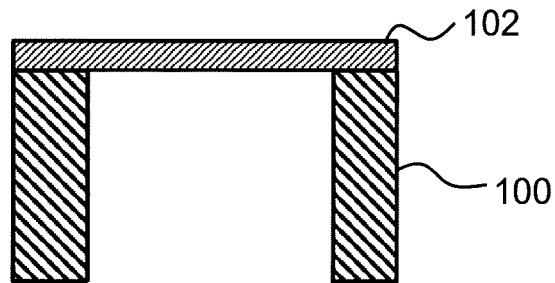
FIG. 2A provides schematic (cross-sectional) views showing a step for producing the pellicle film, the pellicle frame and the pellicle in an embodiment according to the present invention.
Figure 2B:
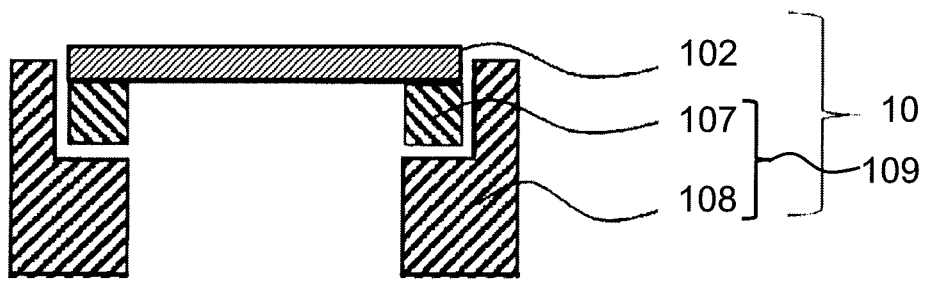
FIG. 2B provides schematic (cross-sectional) views showing a step for producing the pellicle film, the pellicle frame and the pellicle in an embodiment according to the present invention.
Figure 2C:
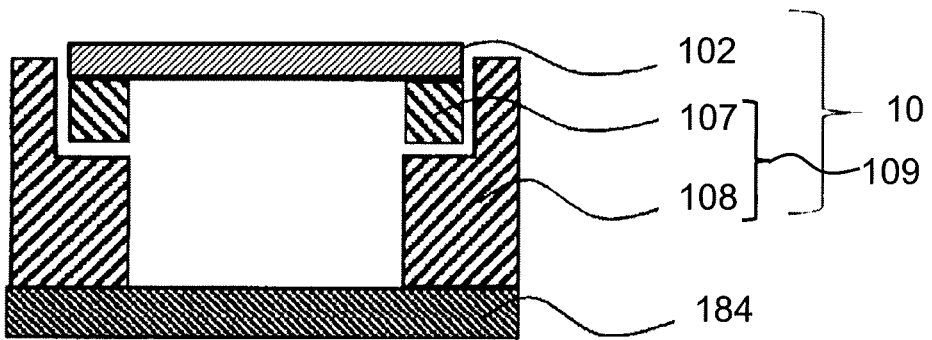
FIG. 2C provides schematic (cross-sectional) views showing a step for producing the pellicle film, the pellicle frame and the pellicle in an embodiment according to the present invention.
Figure 3:
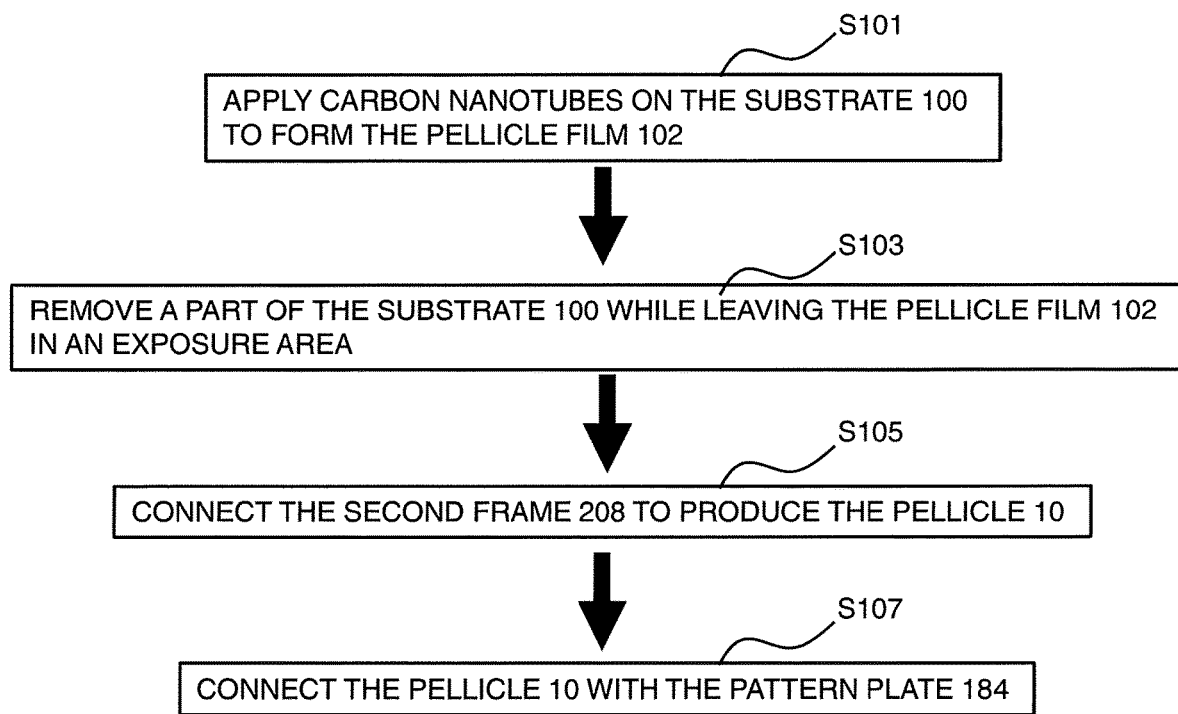
FIG. 3 is a flowchart showing a method for producing the pellicle film, the pellicle frame and the pellicle in an embodiment according to the present invention.

With reference to FIG. 1, FIG. 2 and FIG. 3, a method for producing a pellicle 10 according to the present invention will be described. The pellicle 10 to be produced by the present invention is a pellicle for EUV photolithography. First, above a substrate 100 (FIG. 1(a); for example, a silicon wafer), a pellicle film 102 is formed (FIG. 1(b); S101 in FIG. 3). According to the present invention, a carbon nanotube sheet described below is used as the pellicle film 102.

Carbon nanotubes (or a carbon nanotube bulk structure) to be used for the pellicle film 102 are formed above a substrate for chemical vapor deposition in the state where a metal catalyst is present in a reaction system and by use of a CVD method (e.g., LP-CVD film formation, PE-CVD film formation or the like) of incorporating an oxidant to a reaction atmosphere. In this step, the oxidant may be a water vapor. The water vapor may have a concentration of 10 ppm or higher and 10000 ppm or lower. The water vapor may be incorporated at a temperature of 600° C. or higher and 1000° C. or lower. The metal catalyst may be located or patterned on the substrate for chemical vapor deposition to synthesize the carbon nanotubes. The resultant carbon nanotubes may each be of a single walled or a multiple walled, and may stand perpendicularly to a surface of the substrate for chemical vapor deposition. The carbon nanotubes may be produced by, for example, a super growth method described in detail in WO2006/011655.

The carbon nanotubes (or the carbon nanotube bulk structure) peeled off from the substrate for chemical vapor deposition are used to produce a carbon nanotube sheet. The carbon nanotube sheet may be formed in substantially the same manner as that of a conventional carbon nanotube sheet. Specifically, the resultant carbon nanotubes or carbon nanotube bulk structure is dispersed in a liquid to form a dispersion, and the dispersion is used to form the carbon nanotube sheet.

The dispersion may contain a dispersant. In the case where the dispersant is contained, the bundle is thinner and thus is easily aligned in the planar direction, which is preferred. Examples of usable dispersant include organic side-chain flavin, flavin derivative, sodium dodecylsulfate, sodium cholate, sodium deoxycholate, sodium dodecylbenzenesulfonate, and the like.

As a solvent for the dispersant, an appropriate solvent may be selected in accordance with the solubility of the dispersant. In the case where, for example, organic side-chain flavin is used as the dispersant, the solvent may be toluene, xylene or ethylbenzene. In the case where no dispersant is used, the solvent may be N-methylpyrrolidone (NMP), N,N-dimethylformamide, propyleneglycol, methylisobutylketone (MIBK) or the like.

In the case where the carbon nanotubes by the super growth method is dispersed in a dispersion as thin and uniform bundles, it is desired to use organic side-chain flavin as the dispersant.

As a method of dispersion, any method may be appropriately selected. Ultrasonic dispersion, a ball mill, a roller mill, a vibration mill, a kneader, a jet mill, a nanomizer or the like is usable.

The substrate 100 is coated with the dispersion, and then the liquid used for the dispersion is removed. As a result, the carbon nanotube sheet is formed on the substrate 100. In the case where the substrate is coated with a dispersion containing the carbon nanotubes, according to the present invention, dispersed in a liquid, a film in which the carbon nanotubes are generally parallel to the surface of the substrate is obtained while the liquid used for the dispersion is evaporated and thus is removed (namely, the carbon nanotube sheet does not contain any carbon nanotube standing perpendicular to the surface of the substrate). In this manner, the carbon nanotube sheet is formed. There is no specific limitation on the method of coating. The method of coating may be, for example, spin coating, dip coating, bar coating, spray coating, electrospray coating or the like.

The carbon nanotube sheet formed on the substrate 100 in this manner is used as the pellicle film 102. The metal catalyst used to form the carbon nanotubes may decrease the EUV transmittance. However, since the carbon nanotubes are peeled off from the substrate for chemical vapor deposition, the pellicle film 102 does not contain the metal catalyst used to form the carbon nanotubes almost at all. This is preferred.

A mask 104 is stacked on a surface of the substrate 100 opposite to the surface on which the pellicle film 102 is formed (a rear surface) (FIG. 1(b)). Then, the mask is removed from an exposure area (FIG. 1(c)). Etching is performed to remove a part of the substrate while the pellicle film 102 is left in the exposure area (FIG. 2(a); S103 in FIG. 3).

The part of the substrate is removed by back-etching. As described above, "back-etching" is performed from the rear surface (surface of the substrate opposite to the surface on which the pellicle film is formed).

The substrate 100 does not need to be a silicon wafer substrate. The shape of the substrate is not limited to a true circle, and the substrate may have an orientation flat, a notch or the like formed therein. The pellicle film does not need to be formed on the entire surface of the substrate. It is preferred that the substrate 100, on which the pellicle film is to be formed, is formed of a material containing any one of silicon, sapphire and silicon carbide, instead of an aluminum alloy or the like used for an ArF laser pellicle. Silicon, sapphire and silicon carbide each have a coefficient of linear thermal expansion close to that of the pellicle film, and this is preferred to decrease the thermal strain of the entirety of the pellicle. More preferably, the substrate 100 is formed of silicon.

At the time of back-etching, the silicon wafer may be left, except for the exposure area, in a frame shape for the purpose of concurrently forming a first frame 107 to be connected with the pellicle film 102 (FIG. 2(a)). In this case, the portion of the substrate that is not removed is referred to as the first frame 107. The resultant silicon wafer in the frame shape may be used as the frame in this manner, so that the pellicle frame is produced while a step of extending the pellicle frame on the first frame is omitted.

There is no specific limitation on the shape of the first frame. A relatively large portion of the substrate may be left as the first frame from the point of view of increasing the strength. Before the etching, a different frame may be bonded to the portion of the substrate that is to become the first frame, and etching may be performed in this state. The bonding of the different frame reinforces the first frame. As the different frame, a second frame 108, for example, may be used. In a later step, the second frame 108 may be connected in addition to the first frame 107 (FIG. 2(b); S105 in FIG. 3). It should be noted that since the pellicle for EUV is limited in the height thereof, it is preferred that the pellicle film and the support frame have a total height of 2.6 mm or less. The second frame 108 to be connected may have a jig hole formed therein, with which the pellicle is secured to a pattern plate 184 or the second frame 108 is connected with the first frame.

There is no specific limitation on the shape, size or material of the second frame 108. It is preferred that the material of the second frame 108 has a high tolerance to the EUV light, a high level of flatness, and a low ion elution property. In order to remove carbon-derived contaminants, hydrogen gas is supplied to an exposure device. Therefore, it is preferred that the material of the second frame 108 is tolerant to hydrogen radical. There is no specific limitation on the material of the second frame 108. Any material generally usable for a pellicle frame is usable. Specific examples of the material of the second frame 108 include aluminum, aluminum alloy (5000-type, 6000-type, 7000-type, etc.), stainless steel, silicon, silicon alloy, iron, iron-based alloy, carbon steel, tool steel, ceramic material, metal-ceramic composite material, resin, and the like. Among these materials, aluminum and aluminum alloy, which are lightweight and rigid, are more preferred. The second frame 108 may include a protective film at a surface thereof.

In the pellicle film including the carbon nanotube sheet that includes the bundles, the protective film may cover each of the bundles in the carbon nanotube sheet.

The pellicle frame (assembly of the pellicle film and the first frame connected with the pellicle film) is connected with the second frame 108 to produce the pellicle (FIG. 2(*b*)). The assembly of the first frame 107 and the second frame 108 corresponds to a support frame 109 supporting the pellicle film and including an opening. The pellicle frame (assembly of the pellicle film and the first frame connected with the pellicle film) and the second frame 108 may be secured to each other with an adhesive or may be connected with each other by a pin. More specifically, a pin hole may be formed at a corner edge, along a side or the like of the pellicle frame, a pin hole may be formed at a position in the second frame that overlaps the pin hole of the pellicle frame, and the pellicle frame and the second frame may be connected with each other by a pin.

At the time of lithography, the pellicle 10 is used as being connected with a pattern plate 184 (FIG. 2(*c*); S107 in FIG. 3).

The pellicle film 102 has a thickness of 200 nm or less. The pellicle film includes a carbon nanotube sheet. The carbon nanotube sheet includes bundles each including a plurality of carbon nanotubes. The bundles each have a diameter of 100 nm or less. In the carbon nanotube sheet, the bundles are aligned in the planar direction.

The carbon nanotube sheet includes the bundles each including a plurality of carbon nanotubes. The carbon nanotubes are assembled together by the van der Waals force to form each bundle. The bundle has a thick fiber structure, and is stronger than single carbon nanotubes.

In this embodiment, each of the bundles of the carbon nanotubes included in the carbon nanotube sheet needs to have a diameter of 100 nm or less. A reason for this is that if the diameter of the bundle exceeds 100 nm, the film is thick in a region where the bundles are stacked, and thus it is difficult that the film has a small thickness of 200 nm or less. In this case, a high EUV transmittance is not provided. It is more preferred that the diameter of the bundle is 20 nm or less. As the diameter of each bundle is shorter, the film is thinner in a region where the bundles are stacked. Therefore, the pellicle film has a higher EUV transmittance.

The diameter of the bundle is found as follows.

1) A scanning electron micrograph (SEM) or an atomic force micrograph (AFM) of a range (region) of 0.2 μm×0.2 μm or larger and 2 μm×2 μm or smaller that is captured at an observation ratio of 50000× or higher and 300000× or lower is used.

2) Contours of the bundle are drawn.

3) A distance between two contours of the same bundle in a direction perpendicular to the contours is measured.

4) A node at which the bundle is branched or the branches are joined together, or the vicinity thereof, is not counted for the diameter.

5) An image fulfilling the condition that the two contours each cross, at an angle of 15 degrees or less, a tangential line at a point for which the diameter of the bundle is to be found, or are each parallel to the tangential line, is used.

6) A straight line is drawn from one end to the other end, and the diameter of the bundle is found for each of the contours crossed by straight line.

The bundles forming the pellicle film are aligned in the planar direction of the film. In the present invention, regarding a two-dimensional diffraction image of a cross-section of a carbon nanotube, a direction along the film surface will be referred to as a "planar direction", and a direction perpendicular to the planar direction will be referred to as a "thickness direction".

In the case where the longer axis direction of the carbon nanotube bundle and of the carbon nanotubes is the same as the planar direction of the carbon nanotube sheet, the bundle is aligned in the planar direction. In the case where the longer axis direction of the carbon nanotube bundle and of the carbon nanotubes is in the thickness direction of the carbon nanotube sheet, the bundle is aligned in the thickness direction.

The alignment of the bundle may be found by an electron micrograph and a selected area electron diffraction image of a cross-section of the carbon nanotube sheet.

In the case where the carbon nanotubes or the carbon nanotube bundle of the carbon nanotube sheet is aligned, anisotropy appears in the diffraction image.

It is preferred that the bundle is aligned in the planar direction in an electron micrograph of a cross-section of a range of 50 nm×50 nm or larger of the carbon nanotube sheet. In the electron diffraction, the lattice distance d is expressed by the reciprocal number of the reciprocal lattice vector g.

$$d=1/g \qquad \text{[Expression 1]}$$

The reciprocal lattice vector g is found by the following expression by use of the distance L from the target (carbon nanotube sheet) to a detection surface of the detector of the microscope, the wavelength λ of the electron beam, and the distance r from the center of the film to the diffraction spot.

$$g=r/\lambda L \qquad \text{[Expression 2]}$$

[Direction of the Diffraction in the Carbon Nanotube]

In the selected area electron diffraction image of the cross-section of the carbon nanotube sheet, a peak appears at the position of d=0.21 nm (g=4.6 nm$^{-1}$), which corresponds to 3/2 of the C-C bond distance d derived from the unit lattice of a graphene sheet structure. This diffraction peak is derived from the unit lattice of the graphene sheet, and therefore, appears along the longer axis direction of the carbon nanotube bundle and of the carbon nanotubes.

A peak derived from a triangular lattice of the carbon nanotube bundle appears at, or in the vicinity of, d=0.37 nm (g=2.7 nm$^{-1}$). The strength and the scattering angle of this diffraction depends on the diameter or the set state of the nanotubes. In a nanotube sheet including carbon nanotubes synthesized by the super growth method (SG method), a peak appears at, or in the vicinity of, d=0.37 nm, and exhibits a broad shape. A carbon nanotube sheet including carbon nanotubes synthesized by the eDIPS method has a diameter and a distribution different from those of the carbon nanotubes synthesized by the SG method. Therefore, in the latter carbon nanotube sheet, the position and the shape of the peak are different from those of the former nanotube sheet.

This diffraction peak reflects the lattice derived from the bundle, namely, the interval between the carbon nanotubes in the bundle. Therefore, the diffraction peak appears in a direction perpendicular to the longer axis direction of the carbon nanotube bundle and of the carbon nanotubes.

[Relationship Between the Alignment Direction of the Carbon Nanotube Sheet and the Anisotropy of the Diffraction Peak]

In the case where the carbon nanotube bundle and the carbon nanotubes are completely aligned in the planar direction, the peak at d=0.21 nm (g=4.6 nm$^{-1}$) derived from the unit lattice of the graphene sheet structure strongly appears in the planar direction. By contrast, the peak at, or in the vicinity of, d=0.37 nm (g=2.7 nm$^{-1}$) derived from the triangular lattice of the carbon nanotube bundle strongly appears in the thickness direction.

In the case where the carbon nanotube bundle and the carbon nanotubes are aligned randomly in the planar direction and the thickness direction, both of the diffraction peaks appear in the planar direction and the thickness direction at substantially the same strength.

In the case where the carbon nanotube bundle and the carbon nanotubes are completely aligned in a direction perpendicular to the film surface, the peak at d=0.21 nm (g=4.6 nm$^{-1}$) derived from the unit lattice of the graphene sheet structure strongly appears in the thickness direction. By contrast, the peak at, or in the vicinity of, d=0.37 nm (g=2.7 nm$^{-1}$) derived from the triangular lattice of the carbon nanotube bundle strongly appears in the planar direction.

[Conversion into Numerical Values of the Degree of Alignment in the Case where the Carbon Nanotube Bundle and the Carbon Nanotubes are Aligned in an Intermediate State]

Figure 4:
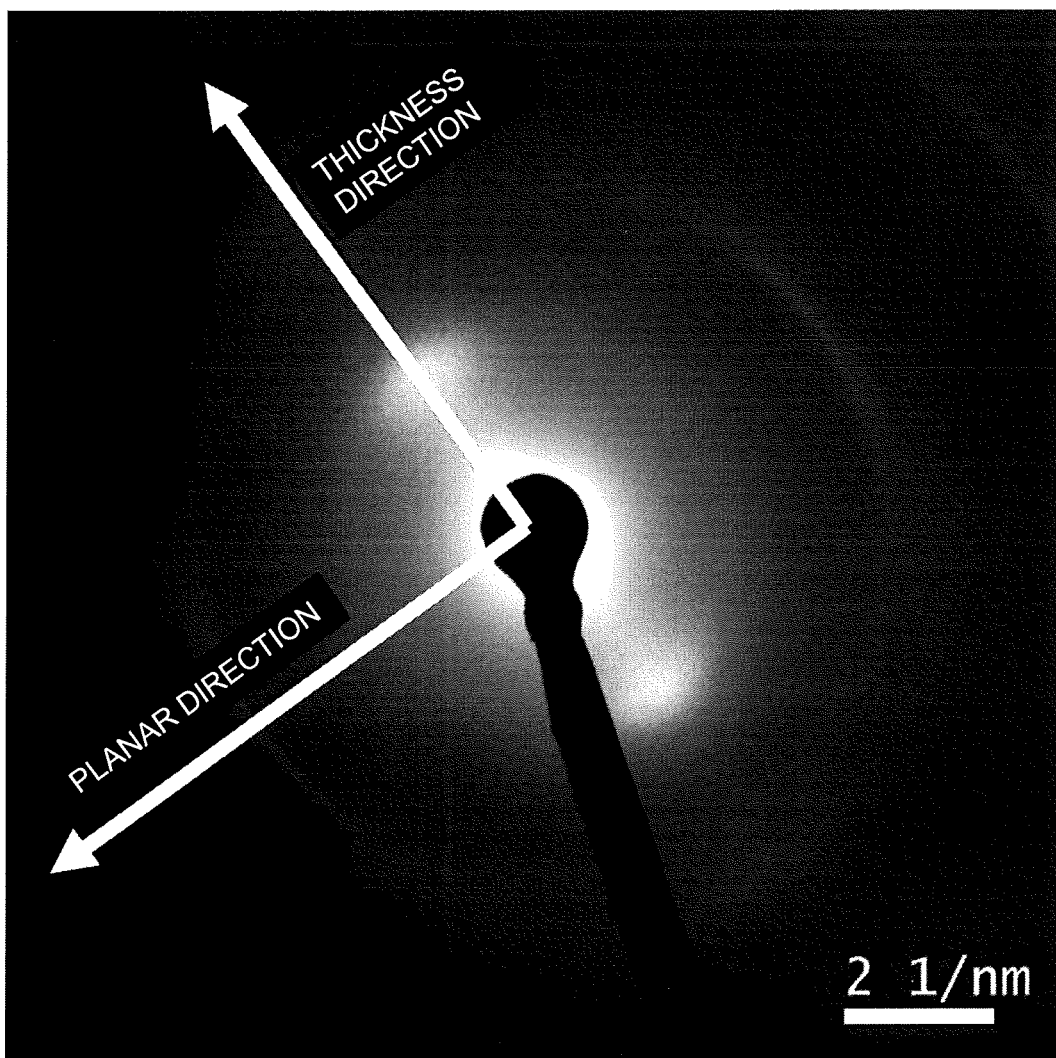
FIG. 4 shows a selected area electron diffraction image of a cross-section of a carbon nanotube sheet in an embodiment according to the present invention.

A strength profile in the planar direction and a strength profile in the thickness direction of a two-dimensional electron diffraction image may be compared against each other and analyzed, so that the degree of alignment is found. FIG. 4 shows an example of selected area electron diffraction image of a cross-section of a carbon nanotube sheet.

Figure 5:
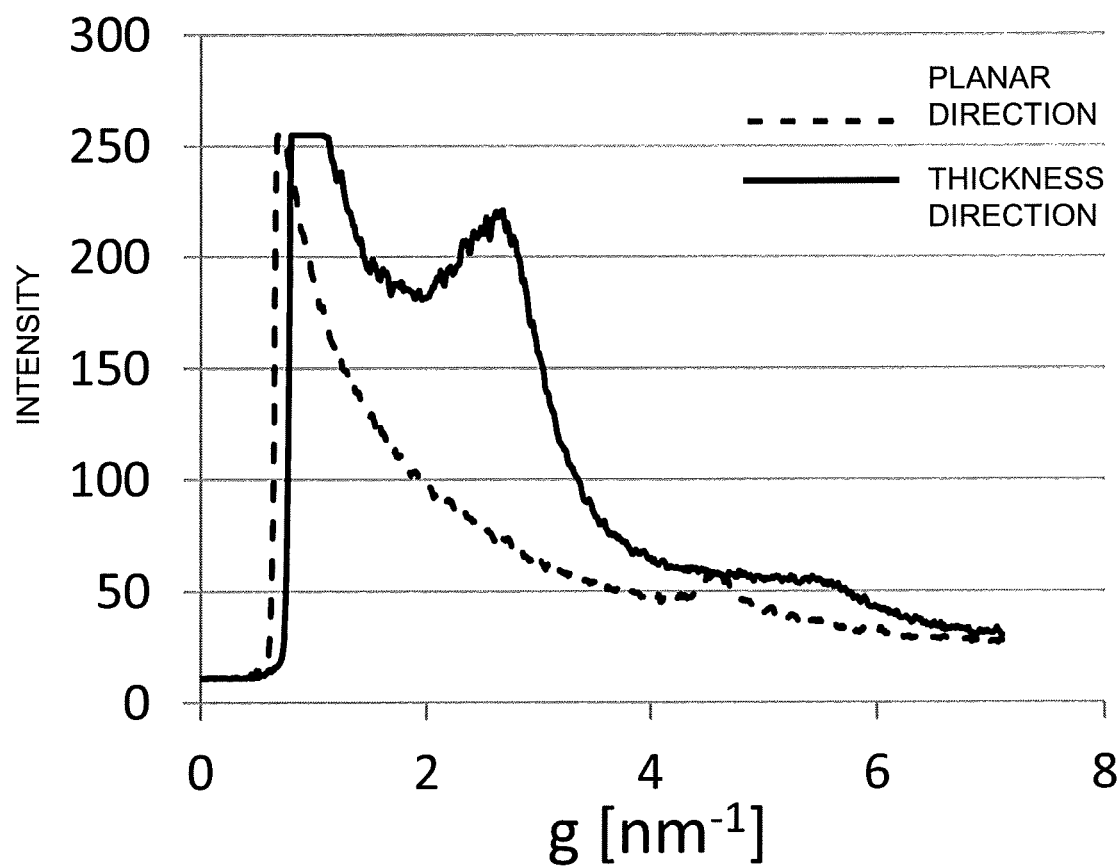
FIG. 5 shows the diffraction strength in a thickness direction and the diffraction strength in a planar direction of a carbon nanotube sheet in an embodiment according to the present invention, plotted with respect to the reciprocal lattice vector g.

FIG. 5 shows the diffraction strength in the thickness direction and the diffraction strength in the planar direction in FIG. 4, plotted with respect to the reciprocal lattice vector g. The vertical axis of FIG. 5 represents the intensity (relative intensity), and shows the diffraction strength of the diffraction image by a gray scale representation in a numerical range of 256 stages of 0 to 255. The diffraction strength may be the detection strength (arbitrary unit) of the detector of the electron microscope, or may be the intensity (relative intensity), of an image obtained from the detection strength distribution of the detector, that is shown by, for example, a gray scale representation in the numerical range of 256 stages of 0 to 255.

(Definition of the Degree of Alignment of the Graphene Sheet Structure (g=4.6 nm$^{-1}$))

Regarding the diffraction peak at d=0.21 nm (g=4.6 nm$^{-1}$) derived from the unit lattice of the graphene sheet structure, the ratio $R_{c-c}$ between the peak strength in the planar direction and the peak strength in the thickness direction is defined by use of the following expression.

$$R_{C-C} = \frac{|I^{th}_{4.6\,nm} - I^{th}_{5.0\,nm}|}{|I^{in}_{4.6\,nm} - I^{in}_{5.0\,nm}|} \quad \text{[Expression 3]}$$

$I_{4.6nm}^{th}$ and $I_{5.0nm}^{th}$ are respectively the diffraction strengths in the thickness direction at g=4.6 nm$^{-1}$ and g=5.0 nm$^{-1}$, and $I_{4.6nm}^{in}$ and $I_{5.0nm}^{in}$ are respectively the diffraction strengths in the planar direction at g=4.6 nm$^{-1}$ and g=5.0 nm$^{-1}$.

The difference in the strength at g=5.0 nm$^{-1}$ is found in order to subtract a strength as a base line at a position not overlapping the peak at g=4.6 nm$^{-1}$ and thus to calculate only the magnitude of the diffraction strength derived from the unit lattice of the graphene sheet structure.

It is preferred to calculate $R_{c-c}$ in the state where the diffraction strength at g=4.6 nm$^{-1}$ is not saturated, by a certain addition condition at the time of measurement or a certain contrast processing on the image.

A value of $R_{c-c}$ of 0.20 or smaller indicates that the alignment is in the planar direction. A value of $R_{c-c}$ exceeding 0.20 indicates that the alignment is not in the planar direction.

The value of $R_{c-c}$ is preferably 0.20 or smaller, and more preferably 0.15 or smaller.

In FIG. 5, $R_{c-c}$ is 0.129, which indicates that the alignment is strong in the planar direction. This is preferred for a pellicle film.

[Definition of the Degree of Alignment of the Bundle Structure (g=2.7 nm$^{-1}$)]

Regarding the peak at, or in the vicinity of, d=0.37 nm (g=2.7 nm$^{-1}$) derived from the triangular lattice of the carbon nanotube bundle, the ratio $R_B$ between the peak strength in the planar direction and the peak strength in the thickness direction is defined by use of the following expression.

$$R_B = \frac{I^{th}_{2.7\,nm} - I^{th}_{2.2\,nm}}{I^{in}_{2.2\,nm} - I^{in}_{2.7\,nm}} \quad \text{[Expression 4]}$$

$I_{2.7nm}^{th}$ and $I_{2.2nm}^{th}$ are respectively the diffraction strengths in the thickness direction at g=2.7 nm$^{-1}$ and g=2.2 nm$^{-1}$, and $I_{2.2nm}^{in}$ and $I_{2.7nm}^{in}$ are respectively the diffraction strengths in the planar direction at g=2.7 nm$^{-1}$ and g=2.2 nm$^{-1}$. g=2.7 nm$^{-1}$ is the value of g at which the diffraction peak in FIG. 5 is provided. g=2.2 nm$^{-1}$ represents the position used to subtract the strength as the base line at a position not overlapping this diffraction peak.

It is preferred to calculate $R_B$ in the state where the diffraction strength at g=2.7 nm$^{-1}$ or g=2.2 nm$^{-1}$ as the base line is not saturated, by a certain addition condition at the time of measurement or a certain contrast processing on the image.

The value of g for calculating $R_B$ is not limited to 2.7 nm$^{-1}$ or 2.2 nm$^{-1}$, and may be appropriately selected. Specifically, it is preferred to use the value of g at which the position of the peak is maximum and to use the value of g at which the strength as the base line may be subtracted at a position not overlapping this diffraction peak.

In the case of random alignment, the diffraction strength in the planar direction and the diffraction strength in the thickness direction are equal to each other. The sign of $I_{2.7nm}^{th} - I_{2.2nm}^{th}$ and the sign of $I_{2.2nm}^{in} - I_{2.7nm}^{in}$ are opposite to each other. Therefore, $R_B=-1$. When $I_{2.7nm}^{th}$ is increased to realize $I_{2.7nm}^{th}>I_{2.2nm}^{th}$, $R_B$ has a positive value. As the alignment in the planar direction is stronger, the value of $R_B$, which is a positive value, is larger.

A value of $R_B$ of 0.40 or larger indicates that the alignment is in the planar direction. A value of $R_B$ smaller than 0.40 indicates that the alignment is not in the planar direction. The value of $R_B$ is preferably 0.40 or larger, and more preferably 0.6 or larger. In FIG. 5, $R_B$ is 1.02, which indicates that the alignment is strong in the planar direction. This is preferred for a pellicle film.

[Analysis on Alignment by Fast Fourier Transform (FFT) of an Electron Micrograph of a Cross-Section]

The degree of alignment in the planar direction of the pellicle film may be found by the fast fourier transform (FFT) of an electron micrograph of a cross-section. In the case where the bundle is aligned in the planar direction, it is preferred that in an FFT image, a strong streak-like pattern appears along the axis in the thickness direction from the center.

Figure 6:
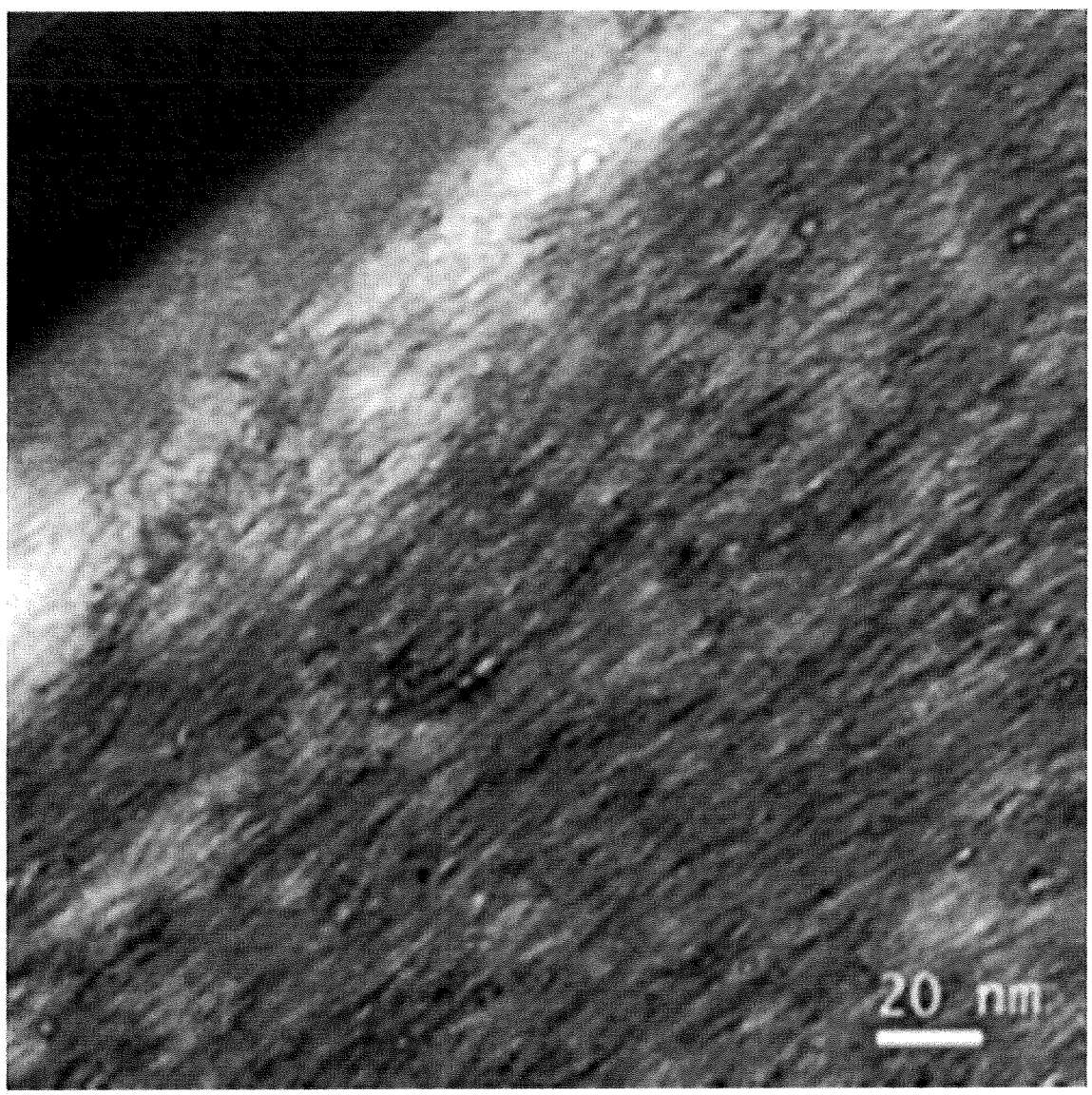
FIG. 6 shows a transmission electron micrograph (TEM) of a cross-section of the carbon nanotube sheet in an embodiment according to the present invention.
Figure 7:
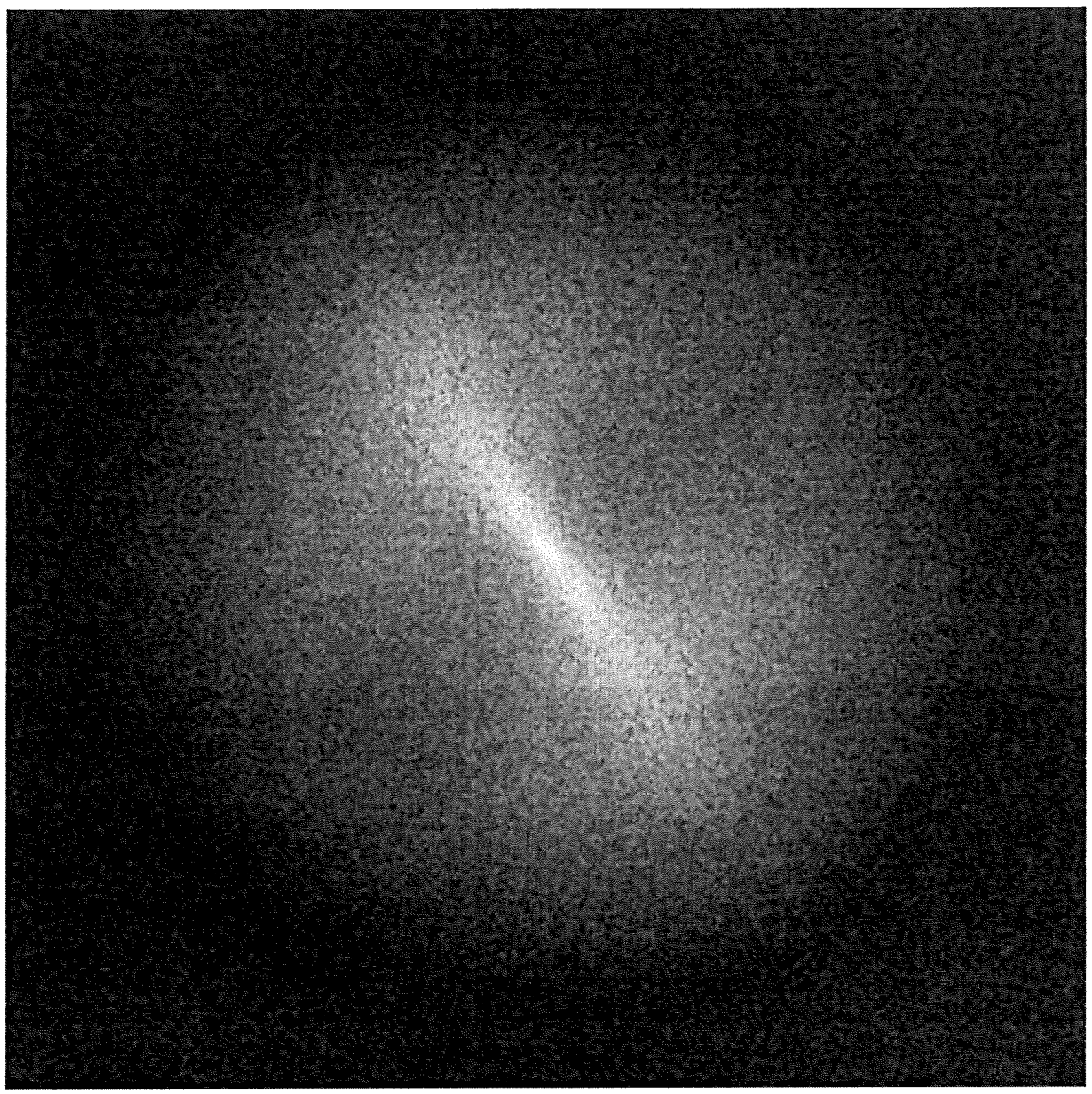
FIG. 7 shows a fast fourier transform (FFT) image of the electron micrograph of the cross-section of the carbon nanotube sheet in an embodiment according to the present invention.

FIG. 6 and FIG. 7 are respectively a TEM image and an FFT image of a cross-section of the carbon nanotube sheet in which the bundle is aligned in the planar direction. It is seen that a strong streak-like pattern appears along the axis in the thickness direction from the center.

Figure 8:
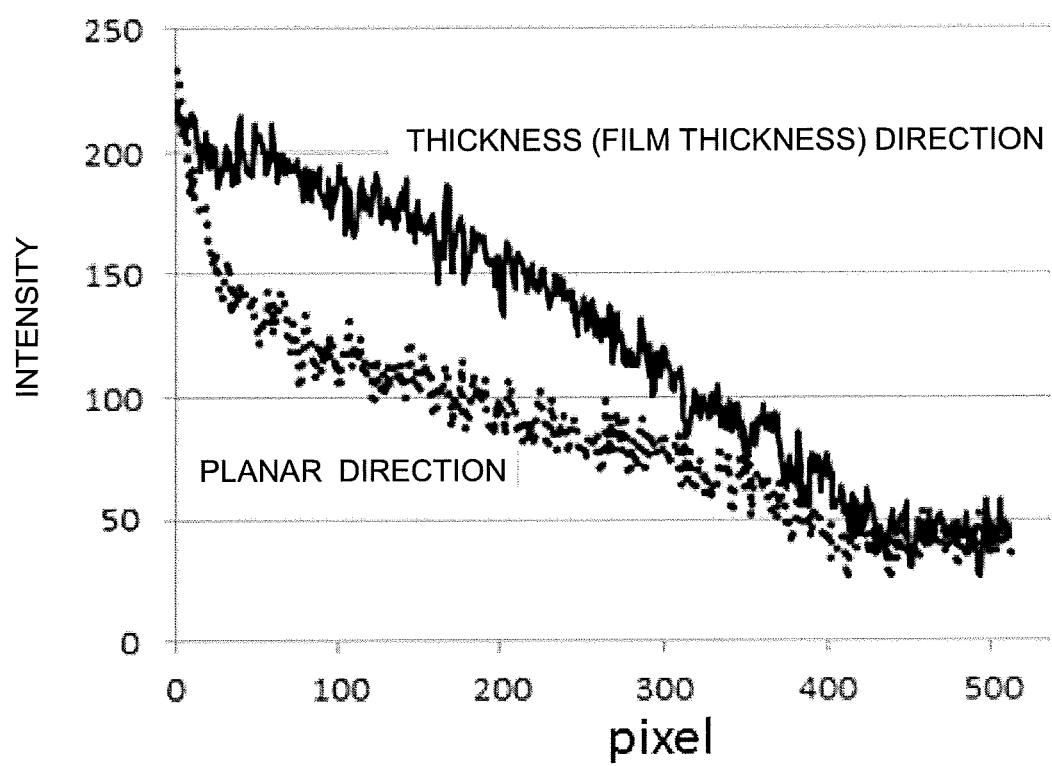
FIG. 8 shows the intensity in the thickness direction and the intensity in the planar direction of the fast fourier transform (FFT) image of the electron micrograph of the cross-section of the carbon nanotube sheet in an embodiment according to the present invention, plotted with respect to the pixel distance from the center.

FIG. 8 shows the intensity in the thickness direction and the intensity in the planar direction in FIG. 7, plotted with respect to the pixel distance from the center.

The vertical axis of FIG. 8 represents the intensity (relative intensity), and shows the FFT image by a gray scale representation in a numerical range of 256 stages of 0 to 255. There is no specific limitation on the unit of the intensity of the FFT image. For example, the intensity (relative intensity) may be shown by a gray scale representation in the numerical range of 256 stages of 0 to 255.

The following expression is used to define the ratio $R_{FFT}$ between the total intensity in the planar direction and the total intensity in the thickness direction.

$$R_{FFT} = \frac{\sum_{i=1}^{n} I_i^{in} - I_{Base}^{in}}{\sum_{i=1}^{n} I_i^{th} - I_{Base}^{th}}$$ [Expression 5]

$I_i^{in}$ and $I_i^{th}$ are respectively the intensities in the planar direction and the thickness direction at a distance of the i'th pixel from the center. $I_{Base}^{in}$ and $I_{Base}^{th}$ respectively represent the intensities as the base line at a position distanced from the center. In FIG. 8, $I_{Base}^{in}$ and $I_{Base}^{th}$ are within the range of 450 to 550 pixels, and are each 45 in the case where the intensity (relative intensity) shown by a gray scale representation in the numerical range of 256 stages of 0 to 255 is used.

A value of $R_{FFT}$ of 0.60 or smaller indicates that the alignment is in the planar direction. A value of $R_{FFT}$ exceeding 0.60 indicates that the alignment is not in the planar direction. The value of $R_{FFT}$ is preferably 0.60 or smaller. In FIG. 8, $R_{FFT}$ is 0.519, which indicates that the bundle is aligned in the planar direction. This is preferred for a pellicle film.

The carbon nanotube sheet in which the bundles are aligned in the planar direction may have a thickness equivalent to the diameter of the bundles. Therefore, a high EUV transmittance is realized. In addition, the carbon nanotube sheet (or the pellicle film) in which the bundles are aligned in the planar direction may have a mesh structure in which the bundles are intertwined with each other in the planar direction. Therefore, the carbon nanotube sheet (or the pellicle film) may be a self-standing film although having a thickness of 100 nm or less.

The carbon nanotube sheet (or the pellicle film) has a mesh structure in which the bundles are intertwined with each other. The mesh structure may be observed in an SEM image or an AFM image of 0.2 μm×0.2 μm or larger and 2 μm×2 μm or smaller captured at an observation ratio of 50000× or or higher and 300000× or lower. In the SEM image or the AFM image, a point at which three or more bundles are coupled to each other is considered as a coupling point. The mesh structure includes straight portions of the bundles, such coupling points and gaps not including the straight portions or the coupling points.

The carbon nanotube sheet having a mesh structure of the bundles aligned in the planar direction, when being supplied with a stress, disperses the stress and also suppresses the deformation or the translation movement of the bundles. Therefore, the carbon nanotube sheet maintains the mesh structure and the self-standing shape thereof even when being supplied with a stress.

The pellicle film 102 includes the carbon nanotube sheet, and the carbon nanotube sheet includes the carbon nanotubes. The carbon nanotubes have a metal catalyst or a light element other than carbon, for example, oxygen or the like, incorporated thereto as impurities during a synthesis step thereof. Herein, the "light element" refers to an element having an atomic number of 18 (argon) or smaller.

The carbon nanotubes in the pellicle film 102 have a carbon content of 98% by mass or higher. For the pellicle film, carbon nanotubes synthesized by a method described in a known document, for example, WO2006/011655 or the like may be used. The amount of the metal material contained in the carbon nanotubes may be measured by use of a fluorescent x ray. Alternatively, carbon nanotubes deprived of a metal catalyst by acid cleaning may be used. The carbon nanotube sheet has a very high purity (carbon content of the carbon nanotube sheet) of 98% by mass or higher, and thus has a high EUV transmittance. Since the EUV transmittance is high, the durability of the pellicle to EUV is high. The light element such as oxygen or the like contained in the carbon nanotubes may be measured by XPS.

In the present invention, the carbon nanotubes in the pellicle film 102 each have a length of 10 μm or longer and 10 cm or shorter and a diameter of 0.8 nm or longer and 6 nm or shorter. Alternatively, the carbon nanotubes have a center size of the diameter of 1 nm or longer and 4 nm or shorter, a length of 10 μm or longer and 10 cm or shorter, and a carbon content of 98% by mass or higher. In this specification, the center size of the diameter of the carbon nanotubes is found as follows. A transmissive electron image of a film surface of the carbon nanotube sheet is captured by a transmission electron microscope (hereinafter, referred to as a "TEM"). From the transmissive electron image, the outer diameter, namely, the diameter, of each of the carbon nanotubes is measured. Based on the data obtained by the measurement, a histogram is created. From the histogram, the diameter of carbon nanotubes occupying 90% of all the carbon nanotubes is calculated. Therefore, the center size of the diameter of the carbon nanotubes of 1 nm or longer and 4 nm or shorter indicates that the diameter of 90% of the carbon nanotubes on the film surface is 1 nm or longer and 4 nm or shorter. The diameter of the remaining 10% of the carbon nanotubes does not need to be in the range of 1 nm or longer and 4 nm or shorter.

In the present invention, the carbon nanotubes are as long as 10 μm or longer and 10 cm or shorter. Therefore, the carbon nanotubes are intertwined with each other to form a tough film (sheet). In addition, the carbon nanotubes have a diameter a long as 0.8 nm or longer and 6 nm or shorter (or the center size of the diameter of the carbon nanotubes is as long as 1 nm or longer and 4 nm or shorter). Therefore, the carbon nanotube sheet has a low density and thus has a high EUV transmittance. The carbon nanotube sheet has a high EUV transmittance, and therefore, is highly resistant against heat and highly durable against EUV. The entirety of the carbon nanotube sheet has a high physical strength. Therefore, the carbon nanotube sheet has a film strength that withstands the pellicle production process and the steps in which the carbon nanotube sheet is subjected to an atmospheric pressure and also to a vacuum state in an EUV exposure system.

In the present invention, it is preferred that the ratio of the length with respect to the diameter of the carbon nanotubes (length/diameter) is $1 \times 10^4$ or higher and $1 \times 10^8$ or lower in the above-described ranges of the diameter and the length of the carbon nanotubes. The ratio may be within such a range, so that the EUV transmittance and the film strength are further increased.

Embodiment 2

In embodiment 2, a substrate for chemical vapor deposition that is used for forming the carbon nanotubes to be used for the pellicle film 102 by a CVD method is used as the substrate 100.

A film of the carbon nanotubes obtained herein includes carbon nanotubes standing perpendicularly to a surface of the substrate. Thus, another substrate is prepared to physically lay down the standing carbon nanotubes; the carbon nanotube film is immersed in a liquid to physically lay down the standing carbon nanotubes; a liquid is caused to flow into the carbon nanotubes to physically lay down the standing carbon nanotubes; or the generated carbon nanotube structure is peeled off and held between two substrates to lay down the standing carbon nanotubes to a horizontal direction. In the present invention, the carbon nanotube sheet in which the carbon nanotubes (or the carbon nanotube structure) is generally parallel to the surface of the substrate is used as the pellicle film 102.

Embodiment 2 is substantially the same as embodiment 1 except for the above.

Embodiment 3

Figure 12:
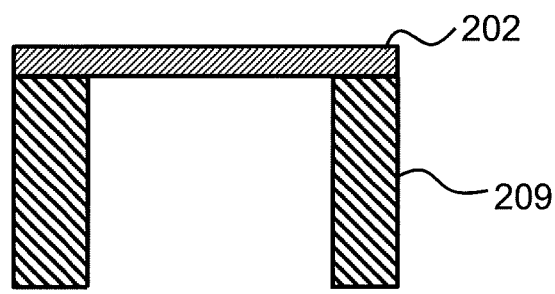
FIG. 12 is a schematic (cross-sectional) view of a pellicle in an embodiment according to the present invention.

In embodiment 3, a pellicle film 202 is supported by a support frame 209 with no use of the first frame or the second frame as the support frame. A method for producing a pellicle 20 according to the present invention will be described with reference to FIG. 12.

Above a substrate for chemical vapor deposition that is formed of a silicon wafer, glass, a metal material, a polymer film or the like, carbon nanotubes (or a carbon nanotube bulk structure) are formed. The resultant carbon nanotubes are caused to float at a liquid surface of a liquid such as water, an organic solvent or the like, and are peeled off from the substrate for chemical vapor deposition. A film of the carbon nanotubes floating at the liquid surface is scooped up by a support frame coated with an adhesive or the like, and thus is secured to the support frame. The film of the resultant carbon nanotubes acts as the pellicle film 202.

As a method for obtaining a self-standing film by causing the carbon nanotubes to float on the liquid and scooping up the carbon nanotubes, a transfer technology of graphene or the like may be used. For example, the film of the carbon nanotubes floating on the liquid surface may be scooped up while the film is supported by a substrate such as a polymer film or the like and in this state is secured to the support frame coated with an adhesive or the like. The substrate such as the polymer film or the like may be removed by etching to produce a carbon nanotube sheet.

In the case where the carbon nanotube bulk structure formed above the substrate for chemical vapor deposition has a sufficiently high strength as a film, the carbon nanotube bulk structure may be mechanically peeled off from the substrate for chemical vapor deposition and used as the pellicle film 202. There is no specific limitation on the method for supporting the pellicle film 202 by the support frame 209. The pellicle film 202 may be supported by a method substantially the same as that for a conventional pellicle film.

The metal catalyst used to form the carbon nanotubes may decrease the EUV transmittance. However, since the carbon nanotubes are peeled off from the substrate for chemical vapor deposition, the pellicle film 202 does not contain the metal catalyst used to form the carbon nanotubes almost at all. This is preferred.

There is no specific limitation on the shape, size or material of the support frame 209. The support frame 209 may be formed of a material substantially the same as that of the second frame.

Figure 9A:
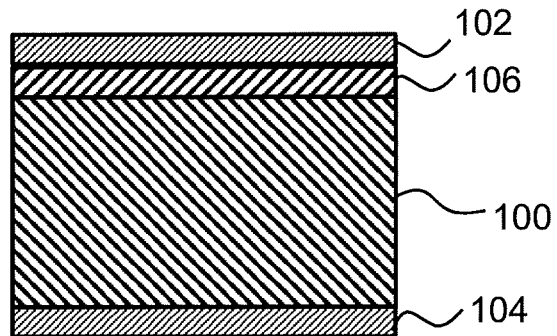
FIG. 9A provides schematic (cross-sectional) views showing steps for producing a pellicle film, a pellicle frame and a pellicle in an embodiment according to the present invention.

[Protective layer The pellicle film for EUV lithography needs to be tolerant to hydrogen radical (i.e., reduction-tolerant) and tolerant to oxidation. Therefore, a protective layer may be provided to protect the carbon nanotube tubes against hydrogen radical or oxidation. A protective layer 106 may be provided in contact with the carbon nanotube sheet. For example, the protective layer 106 may be provided on a surface of the pellicle film 102 or 202 closer to the pattern plate 184; may be provided between the pellicle film 102 and the substrate 100 (FIG. 9(a)); may be stacked as an uppermost layer on the pellicle film 102 or 202; or such manners of provision may be combined. Hydrogen radical may be generated on both of two surfaces of the pellicle film. Therefore, it is preferred to combine the above-described manners of provision; namely, it is preferred that the protective layer 106 is formed on the surface of the pellicle film 102 or 202 closer to the pattern plate 184 and is also stacked as an uppermost layer on the pellicle film 102 or 202.

Figure 9B:
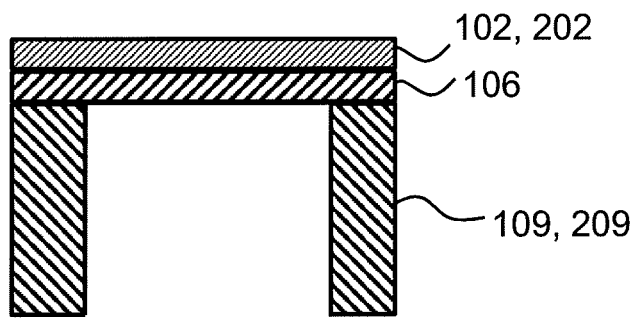
FIG. 9B provides schematic (cross-sectional) views showing steps for producing a pellicle film, a pellicle frame and a pellicle in an embodiment according to the present invention.
Figure 9C:
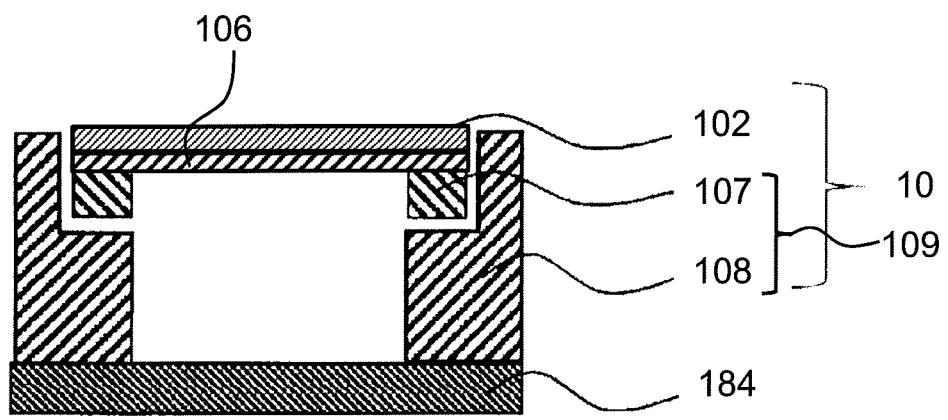
FIG. 9C provides schematic (cross-sectional) views showing steps for producing a pellicle film, a pellicle frame and a pellicle in an embodiment according to the present invention.

FIG. 9 shows a pellicle including the protective layer 106 provided on the surface of the pellicle film 102 or 202 closer to the pattern plate 184 (FIG. 9(b)), and a pellicle 10 including the protective layer 106 provided between the pellicle film 102 and the substrate 100 (FIG. 9(c)). In FIG. 9(c), the pattern plate 184 is connected with the pellicle 10 shown The protective layer 106 may be formed of a material selected from $SiO_x$ (x≤2), $Si_aN_b$ (a/b is 0.7 to 1.5), SiON, $Y_2O_3$, YN, Mo, Ru, Rb, Sr, Y, Zr, Nb, $B_4C$, SiC and Rh.

In order not to inhibit the transmission of EUV light, the protective layer has a thickness of preferably about 1 nm or greater and about 10 nm or less, and more preferably about 2 nm or greater and about 5 nm or less. The thickness of the protective layer may be about 1 nm or greater and about 10 nm or less, so that the EUV light is suppressed from being absorbed into the protective layer and thus the transmittance is suppressed from decreasing.

It is desired that the ratio of the thickness of the protective layer with respect to the thickness of the pellicle film is 0.03 or higher and 1.0 or lower. The ratio may be within the above-described range, so that the EUV light is suppressed from being absorbed into the protective layer and thus the transmittance is suppressed from decreasing.

In the case where the protective layer is stacked, there is an undesirable possibility that the EUV light is reflected by layer interfaces newly generated, namely, an interface between the protective layer and air and an interface between the protective layer and the pellicle film, and as a result, the transmittance is decreased. The reflectance of the EUV light at these layer interfaces, which varies in accordance with the thicknesses of the pellicle film and the protective layer and in accordance with the type of the elements contained in the pellicle film and the protective layer, may be calculated for each of the thicknesses and each of the types of the elements. The thickness of the protective layer may be optimized based on the calculated reflectance, like the principle of a reflection-preventive film, so that the reflectance is decreased.

It is desired that the protective layer has a thickness that is optimal in such a range as to prevent oxidation and reduction while suppressing the decrease in the EUV light transmittance caused by the absorption and the decrease in the EUV light transmittance caused by the reflection. There is no specific limitation on the degree of thickness uniformity or the surface roughness of the protective layer. The protective layer may be provided in a continuous state or in an island state unless the transmission non-uniformity caused by the thickness non-uniformity or the surface roughness of the protective layer, or scattering of the EUV light, causes any inconvenience in a step of patterning the EUV exposure light. The protective layer may have thickness non-uniformity or surface roughness.

It is desired that the average refractive index of the pellicle film, more specifically, the average refractive index of the assembly of the pellicle film and the protective layer, is 1.1 or greater and 3.0 or less. The refractive index may be measured by a technique such as spectroscopic ellipsometry or the like. It is desired that the average density of the pellicle film, more specifically, the average density of the assembly of the pellicle film and the protective layer, is 0.1 g/cm$^3$ or higher and 2.2 g/cm$^3$ or lower. The density may be measured by a technique such as an x-ray reflection method or the like.

The thickness of the pellicle film (in the case where the pellicle film includes two or more layers, the total thickness) may be, for example, 10 nm or greater and 200 nm or less, preferably 10 nm or greater and 100 nm or less, more preferably 10 nm or greater and 70 nm or less, especially preferably 10 nm or greater and 50 nm or less, and further preferably 10 nm or greater and 30 nm or less. As the pellicle film is thinner, the EUV light transmittance of the pellicle film is higher.

The thickness of the pellicle film may be found as follows. The pellicle film is transferred to the substrate, and AFM measurement is performed on a region of 100 μm$^2$ or larger and 1000 μm$^2$ or smaller. The measurement region includes both of the surface of the substrate and the surface of the film. The average height of each of the substrate and the film is measured for a region of 10 μm$^2$ or larger, and the film thickness is found based on the difference between the average thicknesses of the substrate and the film.

It is preferred that the pellicle film has a high EUV light transmittance. The transmittance of the pellicle film for light used for EUV lithography (e.g., light having a wavelength of 13.5 nm or 6.75 nm) is preferably 50% or higher, more preferably 80% or higher, and still more preferably 90% or higher. In the case where the pellicle film and the protective layer are stacked on each other, it is preferred that the light transmittance of the film including the pellicle film and the protective layer is 50% or higher.

(Evaluation on the Tolerance to EUV of the Pellicle Film)

The tolerance to EUV may be evaluated by causing EUV light to irradiate a pellicle film and performing various analyses on an irradiated portion and a non-irradiated portion. Examples of usable techniques include composition analysis techniques such as XPS measurement, EDS analysis, RBS and the like; structural analysis techniques such as XPS, EELS, IR measurement, Raman spectroscopy and the like; film thickness evaluation techniques such as ellipsometry, interference spectroscopy and an x-ray reflection method and the like; and external appearance or surface shape evaluation techniques such as microscopic observation, SEM observation, AFM observation and the like. The heat releasability may be examined in more detail when combined with analysis results obtained by a computer simulation.

The tolerance of the pellicle film is not limited to being evaluated by use of the EUV light. In accordance with the item of evaluation, any appropriate method may be selected from vacuum ultraviolet irradiation, ultraviolet-visible light irradiation, infrared irradiation, electron beam irradiation, plasma irradiation, heat treatment and the like.

In the case where the protective layer is provided, the evaluation may be performed on the pellicle film, more specifically, the assembly of the pellicle film and the protective layer.

[Evaluation on the Film Strength of the Pellicle Film]

The film strength of the pellicle film may be evaluated by use of a nano indenter. Examples of usable techniques for evaluating the film strength include a resonance method, a bulge testing method, a method of evaluating whether or not the film is broken by air-blowing, a method of evaluating whether or not the film is broken by a vibration test, and a tensile strength test performed on the pellicle film by use of a tensile strength tester.

In the case where the protective layer is provided, the evaluation may be performed on the pellicle film, more specifically, the assembly of the pellicle film and the protective layer.

[Film Bonding Layer]

A film bonding layer bonds the support frame 209 and the pellicle film 202 to each other in the case where the support frame 209 and the pellicle film 202 are produced separately. The film bonding layer may be formed of, for example, an acrylic resin adhesive, an epoxy resin adhesive, a polyimide resin adhesive, a silicone resin adhesive, an inorganic adhesive or the like. It is preferred that the film bonding layer performs little outgassing, from the point of view of maintaining the degree of vacuum at the time of exposure to the EUV light. The outgassing may be evaluated by use of, for example, a temperature-programmed desorption gas analyzer.

There is no specific limitation on the method for securing the pellicle film to the support frame. The pellicle film may be directly bonded to the support frame, may be bonded to the support frame via a film bonding layer provided on one end surface of the support frame, may be secured to the support frame mechanically, or may be secured to the support frame by use of an attractive force of a magnet or the like.

Examples of method for evaluating the adhesiveness between the pellicle film and the support frame include a technique of changing the pressure, surface area, distance or angle to evaluate whether or not the film is broken or peeled off by air-blowing, and a technique of changing the acceleration or amplitude to evaluate whether or not the film is broken or peeled off by a vibration test.

[Adhesive Layer for a Pattern Plate]

An adhesive layer for a pattern plate bonds the pellicle and the pattern plate to each other. The adhesive layer for the pattern plate may be provided at an end of a surface of the pellicle on which the pellicle film is not extended. The adhesive layer for the pattern plate may be, for example, a two-sided adhesive tape, a silicone resin pressure-sensitive adhesive, an acrylic pressure-sensitive adhesive, a polyolefin-based pressure-sensitive adhesive, an inorganic adhesive or the like. It is preferred that the adhesive layer for the pattern plate performs little outgassing, from the point of view of maintaining the degree of vacuum at the time of exposure to the EUV light. The outgassing may be evaluated by use of, for example, a temperature-programmed desorption gas analyzer.

The film bonding layer and the adhesive layer for the pattern plate are exposed to the EUV light scattered in the EUV exposure device. Therefore, it is desired that the film bonding layer and the adhesive layer for the pattern plate are tolerant to the EUV light. If the tolerance to the EUV light is low, the adhesiveness or the strength of the adhesive is decreased while the film bonding layer and the adhesive layer for the pattern plate are exposed to the EUV light, and an inconvenience occurs that the adhesive is peeled off or a foreign substance is generated in the exposure device. The tolerance to the EUV light may be evaluated by, for example, a composition analysis technique such as XPS measurement, EDS analysis, RBS or the like; a structural analysis technique such as XPS, EELS, IR measurement, Raman spectroscopy or the like; a film thickness evaluation technique such as ellipsometry, interference spectroscopy, an x-ray reflection method or the like; an external appearance or surface shape evaluation technique such as microscopic observation, SEM observation, AFM observation or the like; or a strength and adhesiveness evaluation technique using a nano indenter or a peel test.

In lithography, the circuit pattern needs to be transferred accurately. Therefore, the transmittance of the exposure light needs to be substantially uniform in the exposure range. Use of the pellicle film in this embodiment provides a pellicle having a constant light transmittance in the exposure range.

[Uses of the Pellicle]

The pellicle according to the present invention may be used as a protective member that suppresses a foreign substance from being attached to the pattern plate in the EUV exposure device, and also used as a protective member that protects the pattern plate during the storage or the transportation thereof. For example, the pellicle may be kept attached to the pattern plate (exposure pattern plate), so that the pattern plate is, for example, stored as it is after being detached from the EUV exposure device. The pellicle may be attached to the pattern plate by a method of bonding with an adhesive, an electrostatic adsorption method, a method of mechanically securing, or the like.

[Exposure Pattern Plate]

The exposure pattern plate in this embodiment includes the pattern plate and the pellicle in this embodiment attached to the pattern plate.

The exposure pattern plate in this embodiment includes the pellicle in this embodiment, and therefore, provides substantially the same effect as that of the pellicle in this embodiment.

There is no specific limitation on the method for attaching the pattern plate to the pellicle in this embodiment. For example, the pattern plate may be directly bonded to the support frame, may be bonded to the support frame via the adhesive layer for the pattern plate that is provided at one end surface of the support frame, may be secured to the support frame mechanically, or may be secured to the support frame by use of an attractive force of a magnet or the like.

The pattern plate may include a support substrate, a reflective layer stacked on the support substrate, and an absorbing layer formed on the reflective layer. The absorbing layer absorbs a part of the EUV light, and as a result, a desired image is formed on a sensitive substrate (e.g., a semiconductor substrate provided with a photoresist film). The reflective layer may be a multi-layer film of molybdenum (Mo) and silicon (Si). The absorbing layer may be formed of a material having a high absorbance of the EUV light or the like, such as chromium (Cr), tantalum nitride or the like.

[Exposure Device]

The exposure device in this embodiment includes the exposure pattern plate in this embodiment, and therefore, provides substantially the same effect as that of the exposure pattern plate in this embodiment.

The exposure device in this embodiment includes a light source releasing exposure light (preferably, EUV light or the like, more preferably EUV light; this is applicable to the following description), the exposure pattern plate in this embodiment, and an optical system guiding the exposure light released from the light source to the exposure pattern plate. It is preferred that the exposure pattern plate is located such that the exposure light released from the light source is transmitted through the pellicle film to irradiate the pattern plate.

In this embodiment, a microscopic pattern (e.g., having a line width of 32 nm or less) is formed by the EUV light or the like. In addition, even in the case where EUV light that may easily cause a resolution failure by a foreign substance is used, patterned exposure is performed in the state where the resolution failure by the foreign substance is suppressed.

[Method for Producing a Semiconductor Device]

The method for producing a semiconductor device in this embodiment includes a step of causing the exposure light, released from the light source, to be transmitted through the pellicle film of the exposure pattern plate in this embodiment and thus to irradiate, and to be reflected by, the pattern plate; and a step of causing the exposure light, reflected by the pattern plate, to be transmitted through the pellicle film and thus to irradiate the sensitive substrate, so that the exposure light exposes the sensitive substrate while having a shape of a pattern.

According to the method for producing the semiconductor device in this embodiment, even in the case where EUV light that may easily cause a resolution failure by a foreign substance is used, the resultant semiconductor device has the resolution failure by the foreign substance suppressed.

Figure 10:
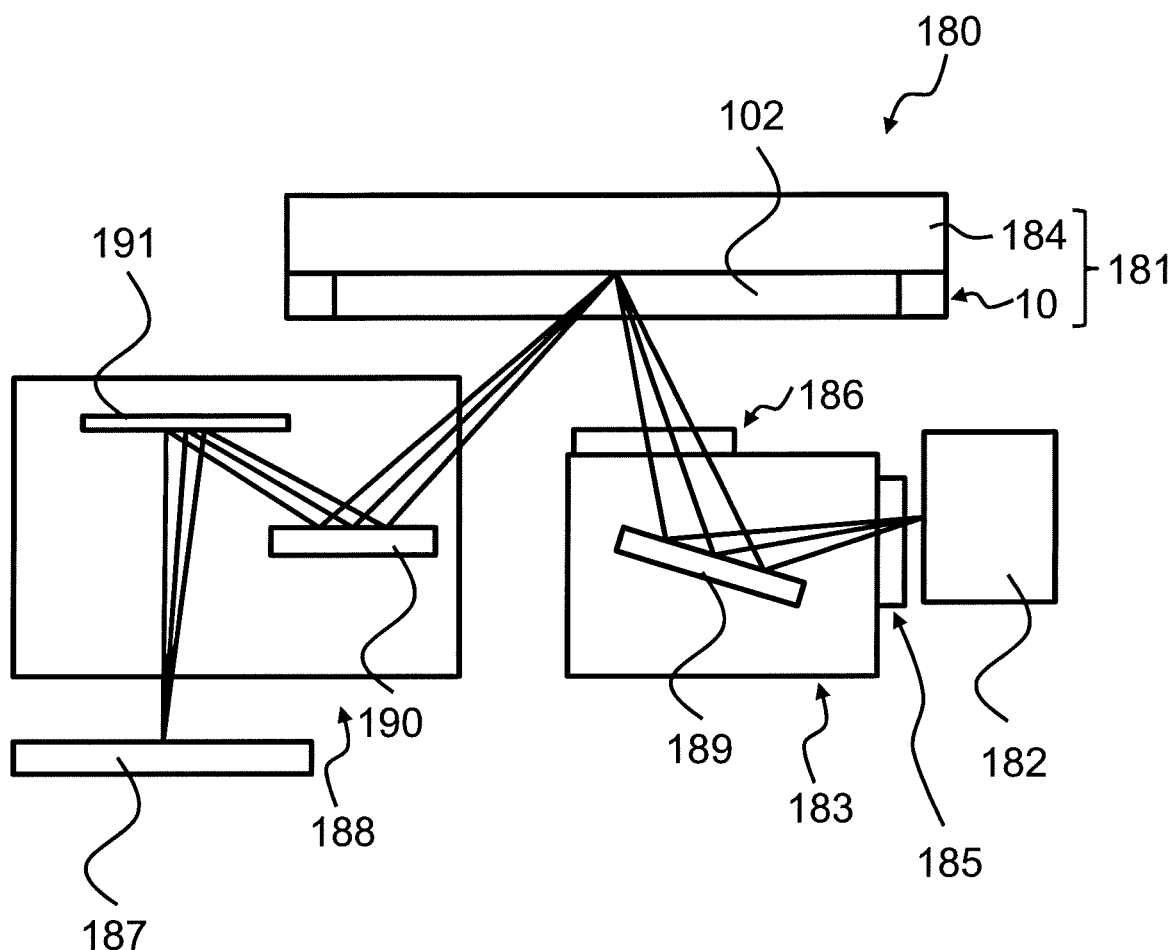
FIG. 10 is a schematic cross-sectional view of an EUV exposure device 180, which is an example of exposure device in an embodiment.

FIG. 10 is a schematic cross-sectional view of an EUV exposure device 180, which is an example of exposure device in this embodiment.

As shown in FIG. 10, the EUV exposure device 180 includes a light source 182 releasing EUV light, the exposure pattern plate 181, which is an example of exposure pattern plate in this embodiment, and an illumination optical system 183 guiding the EUV light released from the light source 182 to the exposure pattern plate 181.

The exposure pattern plate 181 includes the pellicle 10, including the pellicle film 102 and the support frame, and the pattern plate 184. The exposure pattern plate 181 is located such that the EUV light released from the light source 182 is transmitted through the pellicle film 102 and irradiates the pattern plate 184.

The plate 184 reflects the EUV light directed thereto such that the reflected EUV light has a shape of a pattern.

The pellicle film 102 and the pellicle 10 are respectively examples of the pellicle film and the pellicle in this embodiment.

The EUV exposure device 180 includes a filter window 185 provided between the light source 182 and the illumination optical system 183, and includes a filter windows 185 and 186 provided between the illumination optical system 183 and the pattern plate 184.

The EUV exposure device 180 includes a projection optical system 188 guiding the EUV light, reflected by the pattern plate 184, to a sensitive substrate 187.

In the EUV exposure device 180, the EUV light reflected by the pattern plate 184 is guided onto the sensitive substrate 187 via the projection optical system 188, and the sensitive substrate 187 is exposed to the EUV light, so that the EUV light exposes the sensitive substrate 187 while having a shape of a pattern. The exposure with the EUV light is performed under a reduced pressure.

The EUV light source 182 releases the EUV light toward the illumination optical system 183.

The EUV light source 182 includes a target member, a pulsed laser light illuminator and the like. The target member is irradiated with pulsed laser light to generate plasma, so that the EUV light is generated. Where the target member is Xe, the generated EUV light has a wavelength of 13 nm or longer and 14 nm or shorter. The light emitted by the EUV light source is not limited to having a wavelength in the range of 13 nm or longer and 14 nm or shorter, and may have any wavelength suitable to the purpose within the range of 5 nm or longer and 30 nm or shorter.

The illumination optical system 183 collects the light directed from the EUV light source 182, and then uniformizes the illuminance thereof and directs the light toward the pattern plate 184.

The illumination optical system 183 includes a plurality of multi-layer mirrors 189 that adjust the optical path of the EUV light, an optical integrator, and the like. The multi-layer mirrors 189 each include, for example, molybdenum (Mo) films and silicon (Si) films stacked alternately.

There is no specific limitation on the method for attaching the filter windows 185 and 186. The filter windows 185 and 186 may be, for example, bonded with an adhesive or the like, or secured in the EUV exposure device mechanically.

The filter window 185 located between the light source 182 and the illumination optical system 183 captures scattered debris generated by the light source and prevents the scattered debris from being attached to a component in the illumination optical system 183 (e.g., the multi-layer mirrors 189).

The filter window 186 located between the illumination optical system 183 and the pattern plate 184 captures scattered debris generated from the side of the light source and prevents the scattered debris from being attached to the pattern plate 184.

The foreign substance attached to the pattern plate 184 absorbs or scatters the EUV light, and therefore, causes a resolution failure to the wafer. In order to avoid this, the pellicle 10 is attached to cover an EUV irradiation area of the pattern plate 184. The EUV light is transmitted through the pellicle film 102 and irradiates the pattern plate 184.

The EUV light reflected by the pattern plate 184 is transmitted through the pellicle film 102 and irradiates the sensitive substrate 187 via the projection optical system 188.

The projection optical system 188 collects the light reflected by the pattern plate 184 and directs the light toward the sensitive substrate 187. The projection optical system 188 includes, for example, a plurality of multi-layer mirrors 190 and 191 adjusting the optical path of the EUV light.

The sensitive substrate 187 is, for example, a semiconductor wafer coated with a resist. The resist is cured as having a pattern by the EUV light reflected by the pattern plate 184. The resist is developed and the semiconductor wafer is etched, and as a result, a desired pattern is formed on the semiconductor wafer.

The pellicle 10 is attached to the pattern plate 184 via, for example, the adhesive layer for the pattern plate. The foreign substance attached to the pattern plate absorbs or scatters the EUV light, and therefore, causes a resolution failure to the wafer. In order to avoid this, the pellicle 10 is attached to cover an EUV irradiation area of the pattern plate 184. The EUV light is transmitted through the pellicle film 102 and irradiates the pattern plate 184.

The pellicle 10 may be attached to the pattern plate 184 by any method that prevents any foreign substance from being attached to a surface of the pattern plate. The method for attaching the pellicle 10 to the pattern plate 184 may be a method of bonding the pellicle 10 and the pattern plate 184 to each other with an adhesive, an electrostatic adsorption method, a method of mechanically securing the pellicle 10 and the pattern plate 184 to each other, or the like, but is not limited to any of these. The method of boding with an adhesive is preferred.

[Modification 1]

According to the present invention, a step of removing particles may be included. The method for removing the particle may be a wet cleaning method, a mechanical cleaning method, a dry cleaning method or the like, but is not limited to any of these. The wet cleaning method may be RCA cleaning such as SC1 cleaning or SC2 cleaning. The SC1 cleaning has a function of cleaning particles with ammonia and hydrogen peroxide. The SC2 cleaning has a function of cleaning heavy metal with hydrochloric acid and hydrogen peroxide. Other examples of the wet cleaning include cleaning with pure water and cleaning with an organic solvent. Examples of the wet cleaning also include cleaning with SPM (mixture of sulfuric acid and hydrogen peroxide), cleaning with buffered hydrofluoric acid (mixture of hydrofluoric acid and ammonium fluoride), cleaning with hydrofluoric acid, and the like. These types of cleaning may be combined and performed in any order. Examples of the dry cleaning include ashing cleaning with $O_2$ plasma, argon sputtering, and the like.

[Modification 2]

According to the present invention, the substrate, the support frame, the first frame or the second frame may be chamfered in at least one position. In this specification, "chamfering" represents a concept encompassing R-chamfering and C-chamfering. "R-chamfering" refers to forming a curved portion by processing at least one end portion (side surface, corner edge, corner area, etc.) of the substrate, the support frame, the first frame (encompassing the first frame obtained as a result of the substrate being back-etched), or the second frame. In this specification, "C-chamfering" refers to shaving the at least one end portion obliquely (at an angle of 100 degrees or larger and 170 degrees or smaller).

Such processing removes a pierced portion (acute angle portion), and thus chipped-off pieces are not easily generated even if the pellicle collides against some member during the transportation or handling after the production.

[Modification 3]

According to the present invention, at least one hole may be formed in the substrate 100 (FIG. 11). In FIG. 11(a) to FIG. 11(c), holes 130 are formed in four directions of the substrate. FIG. 11(a) is a plan view, and FIG. 11(b) and FIG. 11(c) are each a cross-sectional view taken along line A-A' in the plan view in FIG. 11(a). As shown in FIG. 11(b), one or more holes 130 may be formed in the pellicle film 102 formed on the substrate 100. As shown in FIG. 11(b), the holes do not need to run throughout the substrate. Needless to say, as shown in FIG. 11(c), the holes may run throughout the substrate. As shown in FIG. 11(b) and FIG. 11(c), the holes may be formed in the pellicle film and the substrate. In the case where at least one hole is formed to run throughout the substrate and it is selected to perform trimming by etching in a trimming step, and in the case where back-etching is to be performed, the hole may be once closed before the etching in order to protect the hole, or there may be a step of protecting the hole by a resist. There is no limitation on the size of the holes 130. In the case where, for example, the holes are each to have a generally circular shape, the holes each have a diameter of about 50 μm or longer and about 2000 μm or shorter. Preferably, the holes each have a diameter of about 200 μm or longer and about 700 μm or shorter. There is no specific limitation on the shape of the holes 130. The holes 130 may be polygonal (e.g., generally quadrangular). In the case where the holes 130 are generally quadrangular, there is no limitation on the length of each of four sides. The length of a longer side may be 100 μm or longer and 3000 μm or shorter, and the length of a shorter side may be 50 μm or longer and 1000 μm or shorter. Preferably, the length of the longer side is 150 μm or longer and 2000 μm or shorter, and the length of the shorter side is 100 μm or longer and 700 μm or shorter. As shown in FIG. 11(a), the holes 130 may be located along the side surfaces of the pellicle, but there is no specific limitation on the positions of the holes. The holes 130 may be used as jig holes or air holes for attaching the pellicle film to, or demounting the pellicle film from, the photomask. The holes are not indispensable for the pellicle.

The holes 130 are formed by use of ultra-short pulsed laser light or any other type of laser light, by etching, or the like. In the case where the holes 130 are formed by laser light, it is preferred to use ultra-short pulsed laser light (e.g., picosecond laser light or nanosecond laser light), by which hole formation is performed with less debris, from the point of view of forming a high quality pellicle film with little dust or the like. It should be noted that the holes do not need to be formed in this step. Alternatively, the holes 130 may be formed by etching at the time of back-etching performed on the substrate as described below. In this manner, the production process may be simplified. In this case, after the trimming is performed, the hole formation and the etching are performed at the same time. Nanosecond laser light may be used under the following conditions: cycle oscillation frequency: 5 kHz or greater and 15 kHz or less; pulse energy: 5 W or greater and 15 W or less; scanning rate per second: 5 mm or greater and 30 mm or less; and number of times of scanning: 40 or greater and 300 or less. The conditions are not limited to the above. In the case where the ultra-short pulsed laser light is used, a dross prevention agent for laser light may be used. An example of dross prevention agent is a chemical such as CBX, which is a mixture of isopropyl alcohol (IPA) and micrographite. The dross prevention agent is not limited to this. The dross prevention agent is applied to the substrate before the holes are formed. The dross prevention agent, when being used, is removed by cleaning after the holes are formed. According to another method for preventing attachment of dross, for example, helium gas may be blown toward the substrate while the substrate is processed by laser light. Thus, the attachment of dross may be suppressed.

[Modification 4]

Figure 11A:
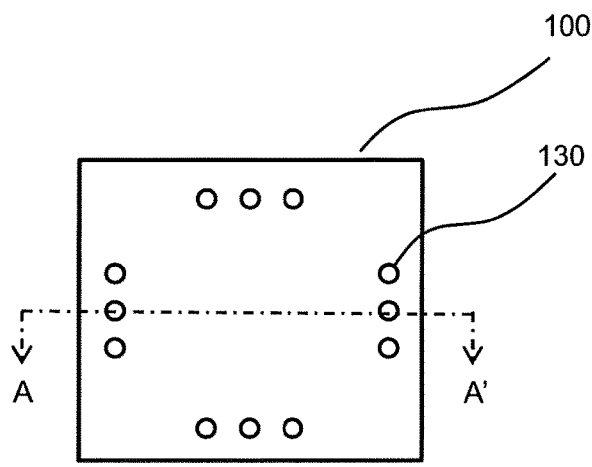
FIG. 11A provides a schematic view showing steps for producing a pellicle film, a pellicle frame and a pellicle in a modification according to the present invention.
Figure 11B:
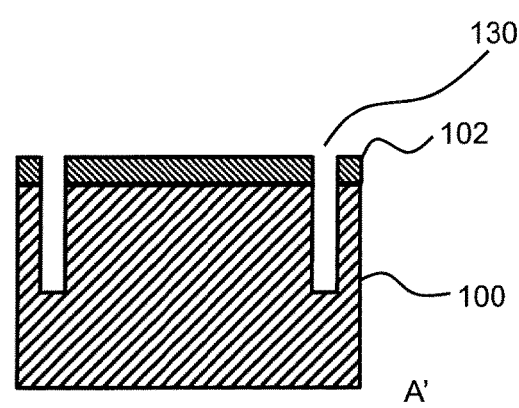
FIG. 11B provides a cross sectional view showing a step for producing a pellicle film, a pellicle frame and a pellicle in a modification according to the present invention.
Figure 11C:
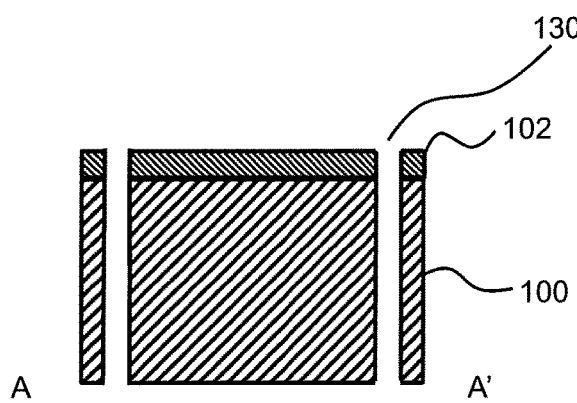
FIG. 11C provides a schematic view showing a step for producing a pellicle film, a pellicle frame and a pellicle in a modification according to the present invention.
Figure 11D:
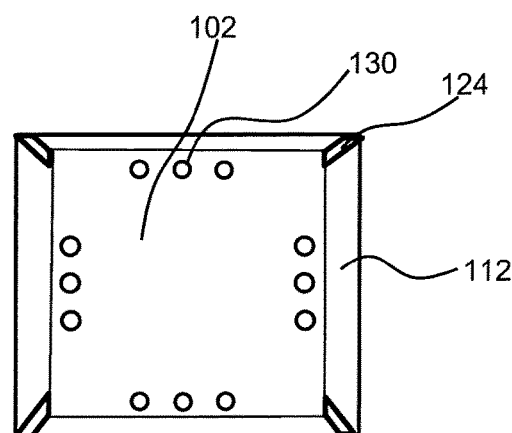
FIG. 11D provides a cross sectional view showing a step for producing a pellicle film, a pellicle frame and a pellicle in a modification according to the present invention.

As shown in FIG. 11(d), the trimming may be performed as follows so as not to generate much dust. An elastic pressure-sensitive adhesive sheet 112, the pressure-sensitive adhesiveness of which is decreased when receiving an external stimulation, is bonded to both of two surfaces of the substrate, and bridges 124 are formed in a region inside the substrate to which the pressure-sensitive adhesive sheet is bonded. Then, a cutout may be formed in each of the bridges 124 to perform the trimming. According to the present invention, only the substrate may be trimmed, or the pellicle film formed on the substrate may be trimmed together with the substrate.

It is conceivable to perform trimming such that the substrate becomes, for example, rectangular. There is no specific limitation on the post-trimming shape of the substrate. The post-trimming substrate may have any shape. There is no specific limitation on the method of trimming. For example, a mechanical force may be applied to cut the pellicle film and the substrate. Alternatively, the substrate and the pellicle film may be trimmed by laser cutting, laser half-cut (stealth dicing), blade dicing, sand blasting, crystal anisotropic etching, or dry etching. A technique that does not generate much dust of foreign substance particles at the time of trimming is preferred. After the back-etching, cleaning cannot be performed because the pellicle film is extremely thin. However, in the case where a step resulting in generating dust, such as a trimming step or the like, is performed before the back-etching, cleaning may be performed before the back-etching. Thus, a pellicle film, a pellicle frame and a pellicle with little dust may be produced.

EXAMPLES

Example 1

300 mg of carbon nanotubes (diameter: 3 nm or longer and 5 nm or shorter; length: 100 μm or longer and 600 μm or shorter; carbon content: 99% or higher) synthesized by the method described in WO2006/011655 and 1 g of organic side-chain flavin were added to 100 mL of toluene. The resultant substance was stirred at about 480 rpm for 2 hours by a magnetic stirrer, and then was subjected to ultrasonic dispersion in a suspension for 2 hours in total by use of a probe-type homogenizer at an output of 40%. During the 2 hours, the substance was cooled for 5 minutes at every 20 minutes. The resultant carbon nanotube dispersion was defoamed.

A silicon substrate was blade-coated with the dispersion. The gap between the blade and the silicon substrate was 240 μm. After the silicon substrate was dried, a film having a thickness of 200 nm was obtained. The organic side-chain flavin was removed with chloroform. Then, the silicon substrate was immersed in a water bath to peel off the carbon nanotube film, and the film was scooped up with a frame to obtain a pellicle film as a self-standing film.

Figure 13:
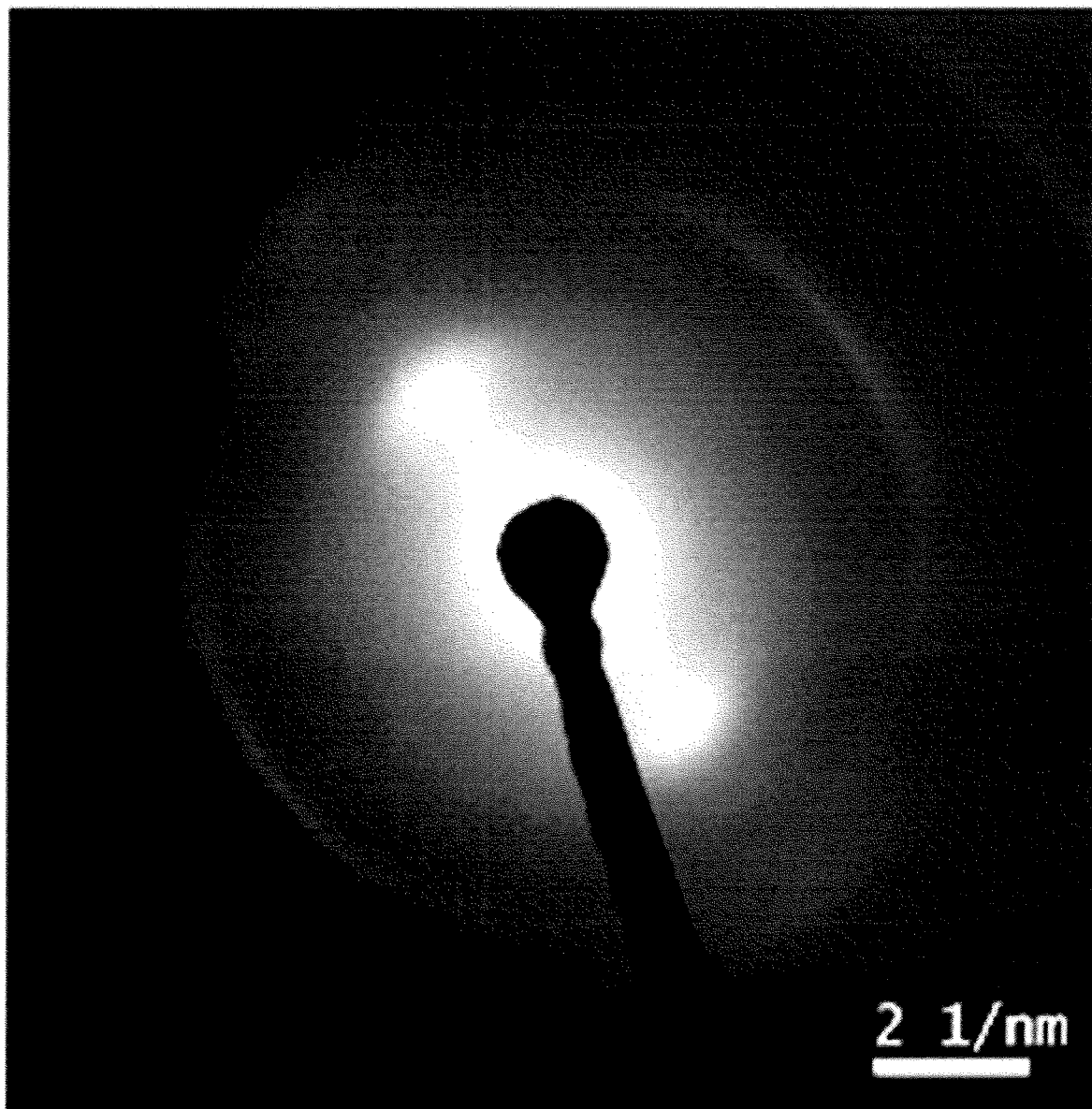
FIG. 13 shows a selected area electron diffraction image of a cross-section of a carbon nanotube sheet in an example according to the present invention.

In an electron micrograph of a cross-section of the obtained pellicle film (FIG. 6), it was observed that the bundles were aligned in the planar direction in the entirety of the film. In a selected area electron diffraction image (FIG. 13), the following was observed. Two rings, seen at d=0.21 nm and d=0.12 nm, derived from the carbon-carbon bond of the carbon nanotubes were weak in the thickness direction of the film and was cut. Broad spots, seen at d=0.37 nm, derived from the triangular lattice structure of the bundles were arrayed in the thickness direction. In this manner, the scattering strength exhibited anisotropy between the thickness direction and the planar direction.

FIG. 5 shows the diffraction strength in the thickness direction and the diffraction strength in the planar direction, plotted with respect to the reciprocal lattice vector g. $R_{c-c}$ obtained from FIG. 5 was 0.129, and $R_B$ obtained from FIG. 5 was 1.02. Based on these, it was found that the bundles formed of the carbon nanotubes were aligned strongly.

In the FFT image of the electron micrograph of the cross-section (FIG. 7), a strong streak-like pattern was shown along the axis in the thickness direction from the center. Based on this, the bundles were confirmed to be aligned in the planar direction.

Figure 14:
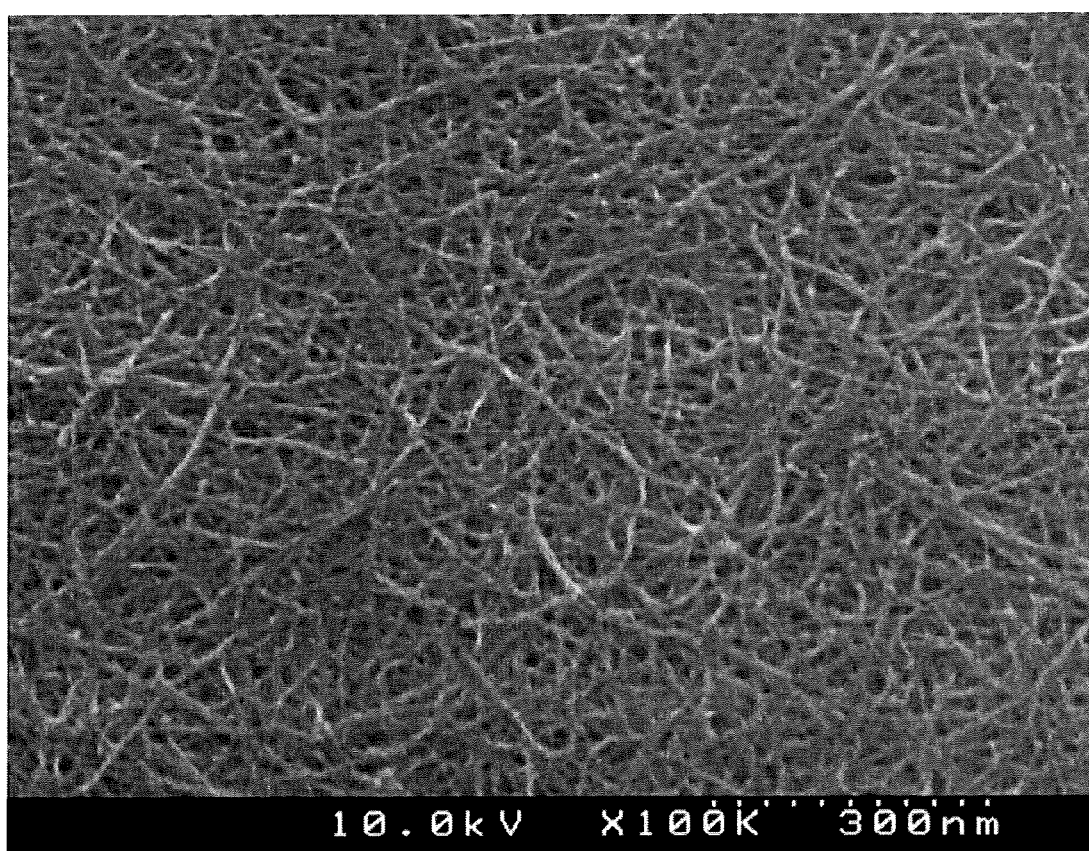
FIG. 14 shows a scanning electron micrograph of the carbon nanotube sheet in the example according to the present invention.

FIG. 8 shows the intensity in the thickness direction and the intensity in the planar direction of the FFT image, plotted with respect to the pixel distance from the center. $R_{FFT}$ was 0.519. Based on this, the bundles were confirmed to be aligned in the planar direction. The average diameter of the bundles found from the SEM image (FIG. 14) was 9.0 nm. There was no bundle having a diameter exceeding 100 nm.

Example 2

Figure 15:
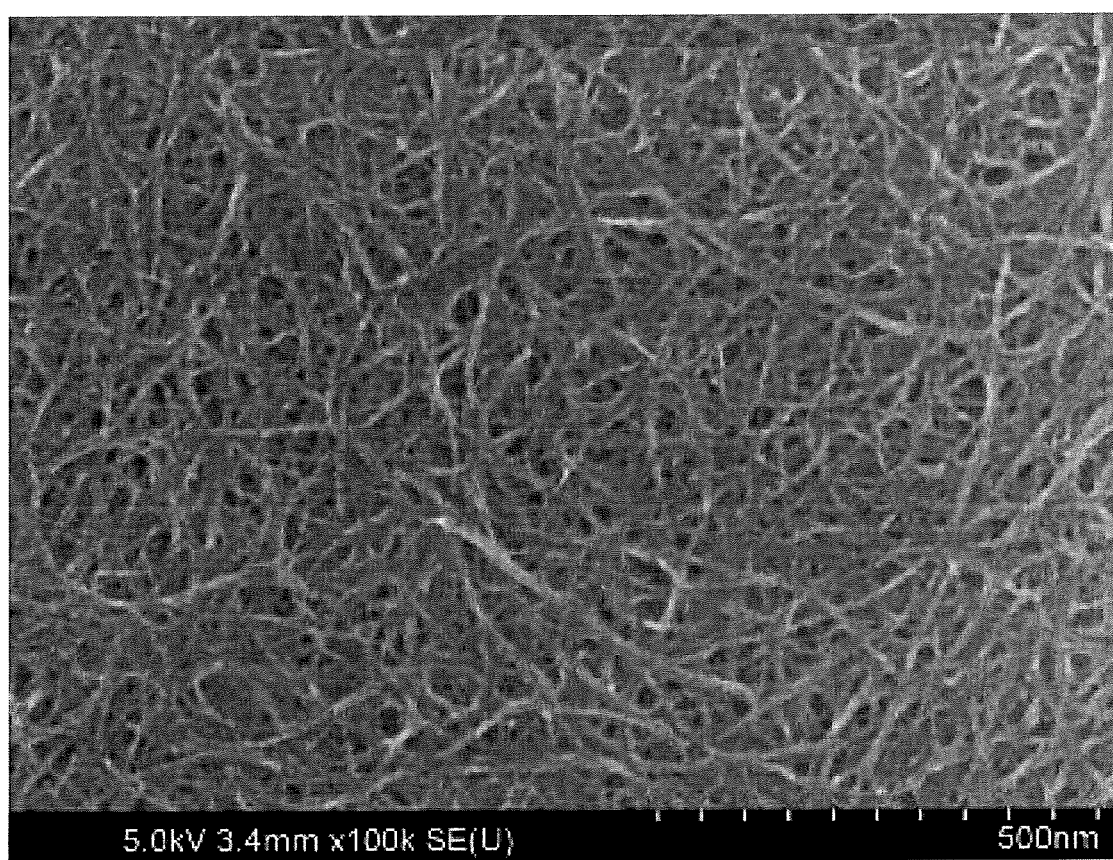
FIG. 15 shows a scanning electron micrograph of a carbon nanotube sheet in an example according to the present invention.

A silicon substrate was blade-coated with a dispersion produced by substantially the same method as in example 1. The gap between the blade and the silicon substrate was 50 μm. After the silicon substrate was dried, a film having a thickness of 40 nm was obtained. The organic side-chain flavin was removed with chloroform. Then, the silicon substrate was immersed in a water bath to peel off the carbon nanotube film, and the film was scooped up with a frame to obtain a pellicle film as a self-standing film. The EUV transmittance of the obtained pellicle film was 85%. The average diameter of the bundles obtained from the SEM image (FIG. 15) was 10.0 nm. There was no bundle having a diameter exceeding 100 nm.

Comparative Example 1

400 mg of carbon nanotubes (diameter: 3 nm or longer and 5 nm or shorter; length: 100 μm or longer and 600 μm or shorter; carbon content: 99% or higher) synthesized by the method described in WO2006/011655 was added to 100 g of propyleneglycol as an organic solvent. The resultant substance was stirred for 2 hours by a magnetic stirrer, and then was subjected to ultrasonic dispersion by use of a probe-type homogenizer. The resultant carbon nanotube dispersion was defoamed. A silicon substrate was blade-coated with the dispersion. The gap between the blade and the silicon substrate was 240 μm. After the silicon substrate was dried, a film having a thickness of 200 nm was obtained.

Figure 16:
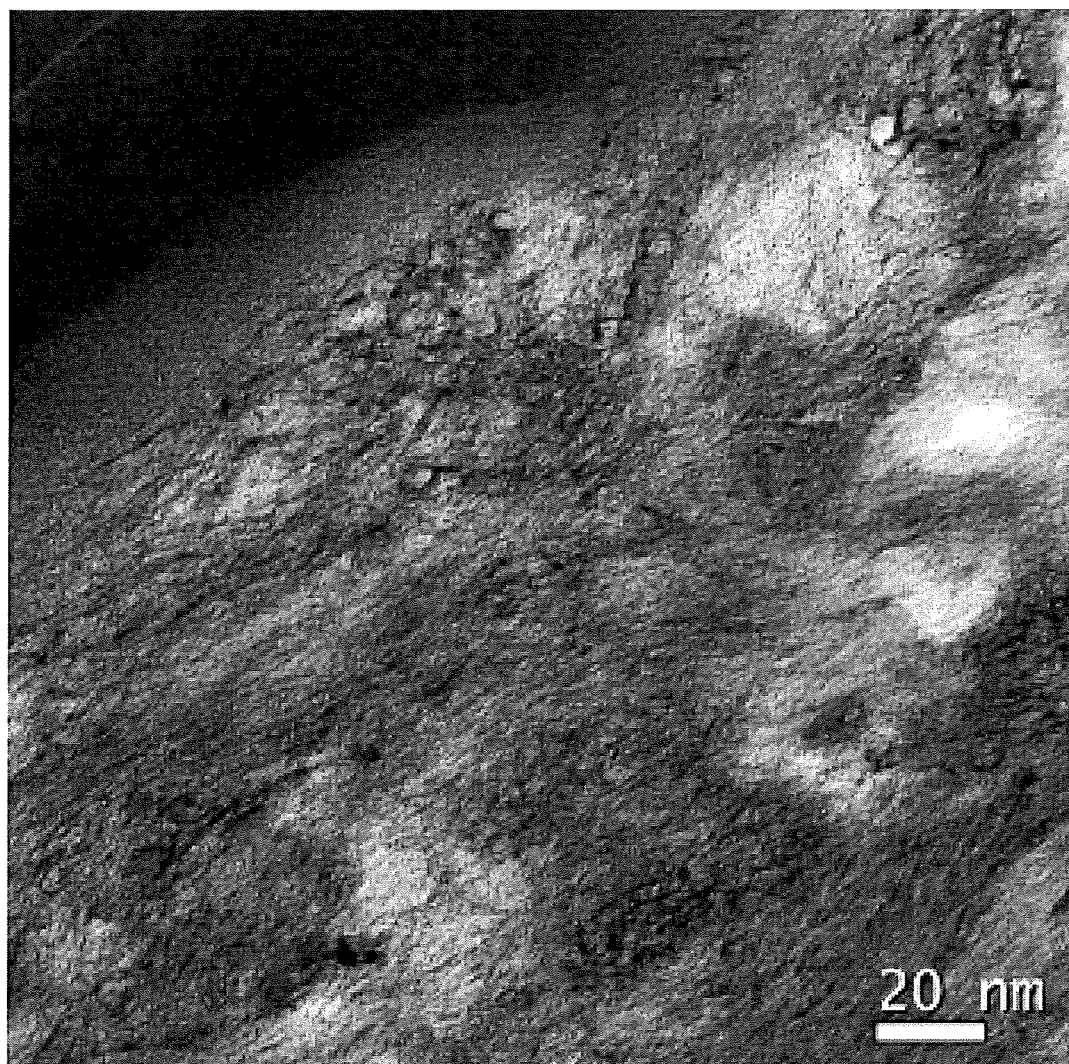
FIG. 16 shows a transmission electron micrograph (TEM) of a cross-section of a carbon nanotube sheet in a comparative example to the present invention.
Figure 17:
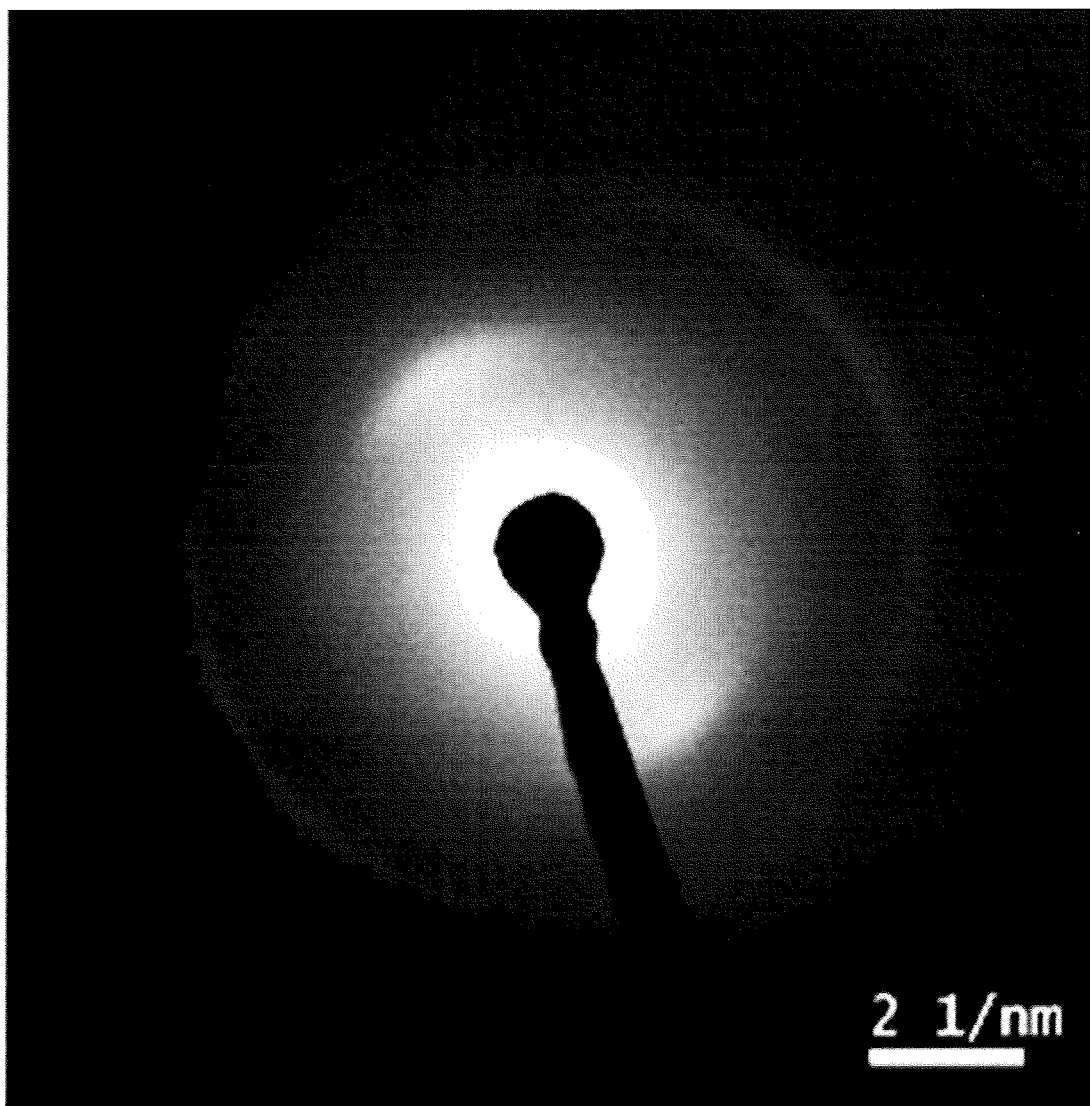
FIG. 17 shows a selected area electron diffraction image of the cross-section of the carbon nanotube sheet in the comparative example to the present invention.

From an electron micrograph of a cross-section of the obtained film (FIG. 16), it was found that the carbon nanotube bundles were not aligned in the planar direction. From a selected area electron diffraction image (FIG. 17), the following was observed. The ring, seen at d=0.21 nm, derived from the carbon-carbon bond of the carbon nanotubes was continuous in the thickness direction. Thus, in almost no region of the film, the bundles were confirmed to be aligned in the planar direction.

Figure 18:
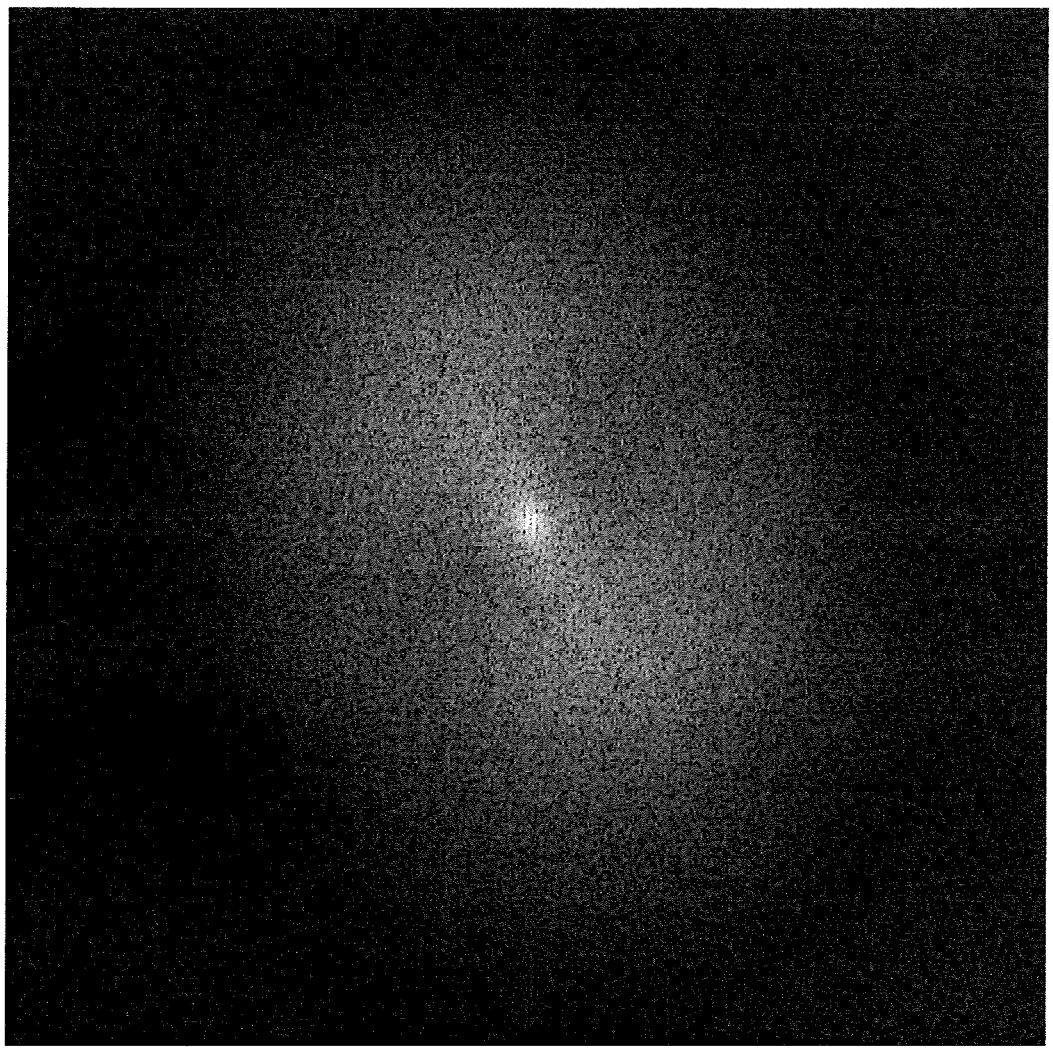
FIG. 18 shows a fast fourier transform (FFT) image of the electron micrograph of the cross-section of the carbon nanotube sheet in the comparative example to the present invention.

$R_{c-c}$ was 0.239, and $R_B$ was 0.353. In an FFT image of the electron micrograph of the cross-section (FIG. 18), no strong streak-like pattern was shown along the axis in the thickness direction from the center. Based on this, the bundles were confirmed not to be aligned in the planar direction. The value of $R_{FFT}$ was 0.616.

Figure 19:
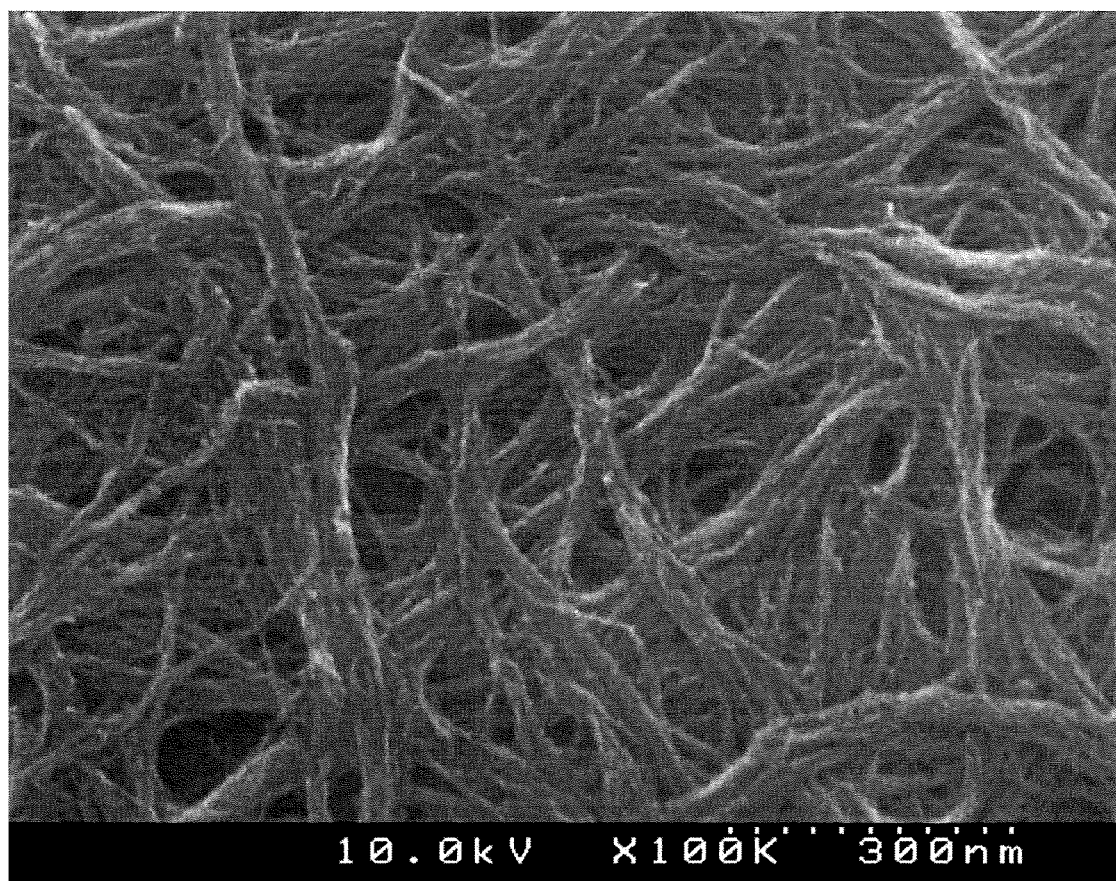
FIG. 19 shows a scanning electron micrograph of the carbon nanotube sheet in the comparative example to the present invention.

In an SEM image (FIG. 19), bundles having a diameter exceeding 100 nm were observed. The above-described substrate was immersed in a water bath. The carbon nanotube film peeled off from the substrate was broken into small pieces when being scooped up with the frame. No self-standing pellicle film was obtained.

Comparative Example 2

A silicon substrate was blade-coated with a dispersion produced by substantially the same method as in comparative example 1. The gap between the blade and the silicon substrate was 100 μm. After the silicon substrate was dried, a film having a thickness of 90 nm was obtained.

The above-described substrate was immersed in a water bath. The carbon nanotube film peeled off from the substrate was broken into small pieces when being scooped up with the frame. No self-standing pellicle film was obtained. In an SEM image, bundles having a diameter exceeding 100 nm were observed.

The method for producing a pellicle film in preferred embodiments according to the present invention has been described. The above-described embodiments are merely examples, and the technological scope of the present invention is not limited to the above. A person of ordinary skill in the art would make various modifications without departing from the gist of the present invention defined by the claims. Therefore, such modifications are to be duly interpreted as being encompassed in the technological scope of the present invention.

Provided are a pellicle film, a pellicle frame and a pellicle having a high EUV transmittance and a high heat resistance. With an exposure pattern plate using the pellicle film, the pellicle frame and or the pellicle, a microscopic pattern (e.g., having a line width of 32 nm or less) is formed by the EUV light or the like. Such an exposure pattern plate and a method for producing a semiconductor device capable of performing patterned exposure in the state where the resolution failure caused by a foreign substance is suppressed are provided.

What is claimed is:

1. A pellicle film for exposure, the pellicle film being extendable over an opening of a support frame comprising:
   a thickness of 40 nm or less of the pellicle film,
   wherein
   the pellicle film includes a carbon nanotube sheet,
   the carbon nanotube sheet includes bundles each including a plurality of carbon nanotubes,
   the bundles each have a diameter of 100 nm or shorter,
   the bundles are aligned in a planar direction in the carbon nanotube sheet, and
   the carbon nanotube sheet has a mesh structure of the bundles in the planar direction.

2. The pellicle film for exposure according to claim 1, wherein the carbon nanotubes each have a diameter of 0.8 nm or longer and 6 nm or shorter.

3. The pellicle film for exposure according to claim 1, further comprising a protective layer in contact with the carbon nanotube sheet.

4. The pellicle film for exposure according to claim 3, wherein the protective layer contains at least one selected from the group consisting of $SiO_x$ ($x \leq 2$), $Si_aN_b$ (a/b is 0.7 to 1.5), SiON, $Y_2O_3$, YN, Mo, Ru, Rb, Sr, Y, Zr, Nb, $B_4C$, SiC and Rh.

5. A pellicle, comprising:
the pellicle film for exposure according to any one of claim 1; and
a support frame supporting the pellicle film.

6. The pellicle film for exposure according to claim 1, wherein the bundles each have a diameter of 20 nm or shorter.

7. A pellicle film, comprising:
a carbon nanotube sheet including:
carbon nanotubes each having a diameter of 0.8 nm or longer and 6 nm or shorter,
a length of 10 μm or longer and 10 cm or shorter, and
a carbon content of 98% by mass or higher,
wherein a thickness of the pellicle film is 40 nm or less,
the carbon nanotube sheet includes bundles each including the carbon nanotubes, and
the carbon nanotube sheet has a mesh structure of the bundles in the planar direction.

8. The pellicle film according to claim 7, wherein the ratio of the length with respect to the diameter of each of the carbon nanotubes (length/diameter) is $1 \times 10^4$ or higher and $1 \times 10^8$ or lower.

9. The pellicle film according to claim 7, further comprising a protective layer in contact with the carbon nanotube sheet.

10. The pellicle film according to claim 9, wherein the protective layer contains at least one selected from the group consisting of $SiO_x$ ($x \leq 2$), $Si_aN_b$ (a/b is 0.7 to 1.5), SiON, $Y_2O_3$, YN, Mo, Ru, Rb, Sr, Y, Zr, Nb, $B_4C$, SiC and Rh.

11. A pellicle, comprising:
the pellicle film according to claim 7; and
a support frame supporting the pellicle film.

12. An exposure pattern plate, comprising:
a pattern plate; and
the pellicle according to claim 11, the pellicle being attached to a surface of the pattern plate, the surface having a pattern.

13. An exposure device, comprising:
the exposure pattern plate according to claim 12.

14. An exposure device, comprising:
a light source releasing exposure light;
the exposure pattern plate according to claim 12; and
an optical system guiding the exposure light released from the light source to the exposure pattern plate,
wherein the exposure pattern plate is located such that the exposure light released from the light source is transmitted through the pellicle film to irradiate the pattern plate.

15. The exposure device according to claim 14, wherein the exposure light is EUV light.

16. A method for producing a semiconductor device, the method comprising the steps of:
causing exposure light, released from a light source, to be transmitted through the pellicle film of the exposure pattern plate according to claim 12 and to irradiate, and to be reflected by, the pattern plate; and
causing the exposure light, reflected by the pattern plate, to be transmitted through the pellicle film and to irradiate a sensitive substrate, so that the exposure light exposes the sensitive substrate while having a shape of a pattern.

17. The method for producing a semiconductor device according to claim 16, wherein the exposure light is EUV light.

18. A pellicle frame, comprising:
the pellicle film according to claim 7; and
a first frame supporting the pellicle film.

19. A pellicle, comprising:
the pellicle frame according to claim 18; and
a second frame connected with the pellicle frame.

20. A method for producing a pellicle, comprising:
incorporating water vapor of 10 ppm or higher and 10000 ppm or lower at a temperature of 600° C. or higher and 1000° C. or lower in the presence of a metal catalyst to form a carbon nanotube by chemical vapor deposition;
dispersing the resultant carbon nanotubes in a solvent including a dispersant by stirring with a magnetic stirrer and further subjecting to ultrasonic dispersion by use of a probe-type homogenizer,
putting the dispersed carbon nanotubes into a sheet to form a carbon nanotube sheet; and
connecting the resultant carbon nanotube sheet to a support frame including an opening such that the resultant carbon nanotube sheet covers the opening.

21. The method for producing a pellicle according to claim 20, wherein the metal catalyst is located on a substrate.

22. The method for producing a pellicle according to claim 20, wherein the dispersant is an organic side-chain flavin.

23. A method for producing a pellicle, comprising:
patterning a metal catalyst on a substrate, and incorporating water vapor of 10 ppm or higher and 10000 ppm or lower at a temperature of 600° C. or higher and 1000° C. or lower in the presence of the metal catalyst to form a plurality of single-wall carbon nanotubes by chemical vapor deposition and thus to form a carbon nanotube bulk structure;
dispersing the resultant carbon nanotube bulk structure consisting of a plurality of carbon nanotubes in a solvent including a dispersant by stirring with a magnetic stirrer and further subjecting to ultrasonic dispersion by use of a probe-type homogenizer,
putting the dispersed carbon nanotubes into a sheet to form a carbon nanotube sheet; and
connecting the resultant carbon nanotube sheet to a support frame including an opening such that the resultant carbon nanotube sheet covers the opening.

24. The method for producing a pellicle according to claim 23, wherein the dispersant is an organic side-chain flavin.

* * * * *